(12) United States Patent
Cookman et al.

(10) Patent No.: US 8,108,749 B2
(45) Date of Patent: Jan. 31, 2012

(54) DIVERSITY COMBINING ITERATIVE DECODER

(75) Inventors: Jordan Christopher Cookman, San Jose, CA (US); Ping Dong, Cupertino, CA (US); Tao Yu, Milpitas, CA (US)

(73) Assignee: Zoran Corporation, Sunnyvale, CA (US)

( * ) Notice: Subject to any disclaimer, the term of this patent is extended or adjusted under 35 U.S.C. 154(b) by 1000 days.

(21) Appl. No.: 12/043,798

(22) Filed: Mar. 6, 2008

(65) Prior Publication Data

US 2009/0228756 A1 Sep. 10, 2009

(51) Int. Cl.
*H03M 13/00* (2006.01)

(52) U.S. Cl. ........ 714/752; 714/758; 375/141; 375/143; 375/144; 375/148; 455/101

(58) Field of Classification Search .................. 714/752, 714/758; 375/141, 143, 144, 148, 299; 370/340; 455/101
See application file for complete search history.

(56) References Cited

U.S. PATENT DOCUMENTS

| 7,068,705 | B2* | 6/2006 | Schilling ..................... 375/141 |
| 2002/0071505 | A1 | 6/2002 | Cameron et al. |
| 2002/0106008 | A1* | 8/2002 | Guey ............................ 375/148 |
| 2004/0076245 | A1 | 4/2004 | Okamoto et al. |
| 2005/0185739 | A1 | 8/2005 | Hansen et al. |
| 2006/0098760 | A1* | 5/2006 | Shen et al. ..................... 375/299 |
| 2006/0184839 | A1 | 8/2006 | Golitschek Edler Von Elbwart et al. |

FOREIGN PATENT DOCUMENTS

EP 1 467 492 A1 10/2004

OTHER PUBLICATIONS

Young Ho Oh; A Recursive Trellis Decoder to Approach The Shannon Capacity in ATSC DTV Receivers; 2 pp; Dept. of Electronics and Computer Engineering, Chonnam National University, Gwangju, Korea.
Advanced Television Systems Committee, ATSC Digital Television Standard Part 2—RF/Transmission System Characteristics (A/53, Part 2:2007), Jan. 3, 2007, pp. 1-44.

* cited by examiner

*Primary Examiner* — Sam Rizk
(74) *Attorney, Agent, or Firm* — Fulbright & Jaworski L.L.P.

(57) ABSTRACT

An iterative decoder circuit includes an N number of sub-decoders, N−1 of the sub-decoders each being responsive to a baseband signal from one of M number of signal processing circuits. Each of the N−1 number of sub-decoders includes, an inner delay responsive to a baseband signal provided by a corresponding signal processing circuit for generating an inner delayed signal, a modified decoder that receives the inner delayed signal and generates a set partition signal, some of which have less errors than previous set partition signals. An Nth inner delay is responsive to the baseband signal and provides an Nth inner delayed signal. An Nth modified decoder is responsive to the Nth inner delayed signal and to the set partition signal and provides an output signal, wherein the probability of error of the output signal is reduced by correcting errors in some of the set partition signals.

22 Claims, 16 Drawing Sheets

DIVERSITY COMBINING ITERATIVE DECODER

BACKGROUND OF THE INVENTION

1. Field of the Invention

The present invention relates generally to wireless digital communication systems and particularly to receivers employed in such systems and including iterative decoder.

2. Description of the Prior Art

In wireless digital communication systems, the orientation of the receive antenna can have a major impact on receiver performance. Some antenna orientations may render the signal unusable by the receiver. One well-known approach to overcome this problem is the use of "antenna diversity." This involves receiving the same transmit signal with two or more receive antennas, and combining the signals in the receiver. The combined signal in this type of receiver generally has a higher probability of being decoded correctly than either of the constituent signals alone.

The optimum approach for combining signals in a diversity receiver is called "maximal ratio combining." This approach is well-known in the art, and dates back to the days of analog communications and vacuum tubes. It involves weighting each signal by its respective signal to noise ratio, then adding the signals together. Other sub-optimal approaches have been studied for wireless digital communications, which have lower levels of performance but less implementation complexity compared to the maximal ratio combiner. One approach called "block-based selection" involves simply selecting a block of data with no bit errors, if available from any one of the signal paths. Many digital communication systems include block codes that allow the receiver to detect and/or correct bit errors in blocks of data. Examples are Reed-Solomon (RS) codes and cyclic redundancy check (CRC) codes. Decoding results for these codes can be used in a receiver to perform block-based selection among the outputs of multiple decoders operating on signals from multiple antennas. Although block-based selection cannot match the performance of maximal ratio combining, especially for the case of a flat additive white Gaussian noise (AWGN) channel, it provides significant gain over the single antenna case for many practical scenarios.

Known diversity combiners typically process the signals received from multiple antennas in parallel. However, this approach is limited in that the output of one decoder cannot be used to influence another decoder's operation.

In digital communication systems, it is common to use two levels of error correction coding, an inner code and an outer code, with an interleaver in between. In general, the inner code enables correction of shorter error events, while the combination of interleaver and outer code enables correction of longer error events. For example, in digital television signals transmitted according to standard A/53 from the Advanced Television Systems Committee (ATSC), an inner trellis code is used along with an interleaver and an outer Reed-Solomon code.

In traditional prior art receivers, the inner decoder and outer decoder operate independently, with a de-interleaver in between. However, these traditional receivers typically operate several dB away from the Shannon limit for their respective data rates and signal bandwidths. For example, the best traditional ATSC receivers typically can handle about 14.9 dB carrier-to-noise ratio (C/N) at the Threshold of Visibility (TOV), whereas the Shannon limit is about 10.5 dB. Part of this difference can be attributed to limitations of the trellis and Reed Solomon (RS) codes themselves. However, a significant part of this difference is due to the traditional decoder architecture, which does not fully utilize the power of the trellis and RS codes. An example of such a prior art system is shown in FIG. 1.

FIG. 1 shows a prior art decoder 10 to include an inner decoder 12, receiving its input from a signal processing circuit (not shown), coupled to a de-interleaver 14, which is shown coupled to an outer decoder 16. The inner decoder 12 typically utilizes trellis decoding techniques, for example the Viterbi algorithm, to partially decode the signal received from the signal processing circuit and the outer decoder 16 typically uses RS decoding techniques, for example the Berlekamp-Massey algorithm, to decode the remainder of the coding present in the received signal. The outer decoder 16 provides the signal that is sought to be received and decoded. Note that the ATSC A/53 system includes a randomizer, so the outer decoder output must also be processed by a de-randomizer (not shown) to generate the final output of the receiver. No matter how optimal their decoding algorithms are, the inner and outer decoders 12 and 16 cannot fully utilize the power of the concatenated coding techniques, because the inner and outer decoders 12 and 16 operate independently of each other.

Attempts have been made to harness the full power of concatenated codes such as those used in ATSC A/53 transmission. In some prior art systems, an iterative decoder involves re-interleaving, re-encoding, and re-mapping an outer decoder output to generate known inputs to a subsequent inner decoder and is in reference to Direct Broadcast Satellite (DBS) standards. A limitation in the foregoing prior art system is that the re-encoding process can have infinite memory, so an error in the outer decoder output can cause the re-encoded output to be wrong from that point forward. In some transmission systems, this issue may be mitigated by the fact that the encoder state is reset at regular intervals. However, this is not the case in many transmission systems, including that defined in ATSC A/53.

Other prior art techniques use parity information from an outer decoder to improve performance of a subsequent inner decoder and lay claim to enabling decoding of the ATSC A/53 signal at 14.6 dB C/N, a gain of 0.3 dB. Although some information from the outer decoder is used to improve inner decoder performance, this technique does not fully utilize all of the information. For example, it does not make use of the reliably corrected data bits available at the output of the Reed-Solomon decoder.

In yet other prior art techniques, an iterative decoder involves re-interleaving a "marked decoded output" from an outer decoder, and using it to discount states in a subsequent inner decoder and lay claim to a gain of about 1.0 dB in C/N performance for codes used in Digital Video Broadcasting (DVB) standards. The primary cost associated with this gain is the extra memory required to store delayed inputs and perform re-interleaving. Each decoder iteration, in the foregoing technique, requires a large amount of extra memory, and no mechanism is provided for trading off memory size and performance for a given number of iterations.

Moreover, all of the prior art iterative decoders described above are directed to single input scenarios.

In light of the foregoing, there is a need for a diversity combiner that makes use of iterative decoding that more fully utilizes the power of its concatenated codes, and that reduces memory size while maintaining or improving performance. There is further a need for such a diversity combiner to be applicable to signals transmitted according to ATSC A/53.

SUMMARY OF THE INVENTION

Briefly, in one embodiment of the present invention, an iterative decoder circuit includes an N number of sub-decoders, N−1 of the sub-decoders each being responsive to a baseband signal from one of M number of signal processing circuits. Each of the N−1 number of sub-decoders includes, an inner delay responsive to a baseband signal provided by a corresponding signal processing circuit for generating an inner delayed signal, a modified decoder that receives the inner delayed signal and generates a set partition signal, some of which have less errors than previous set partition signals. An Nth inner delay is responsive to the baseband signal and provides an Nth inner delayed signal. An Nth modified decoder is responsive to the Nth inner delayed signal and to the set partition signal and provides an output signal, wherein the probability of error of the output signal is reduced by correcting errors in some of the set partition signals.

The foregoing and other objects, features and advantages of the present invention will be apparent from the following detailed description of the preferred embodiments which make reference to several figures of the drawing.

IN THE DRAWINGS

Figure 12:
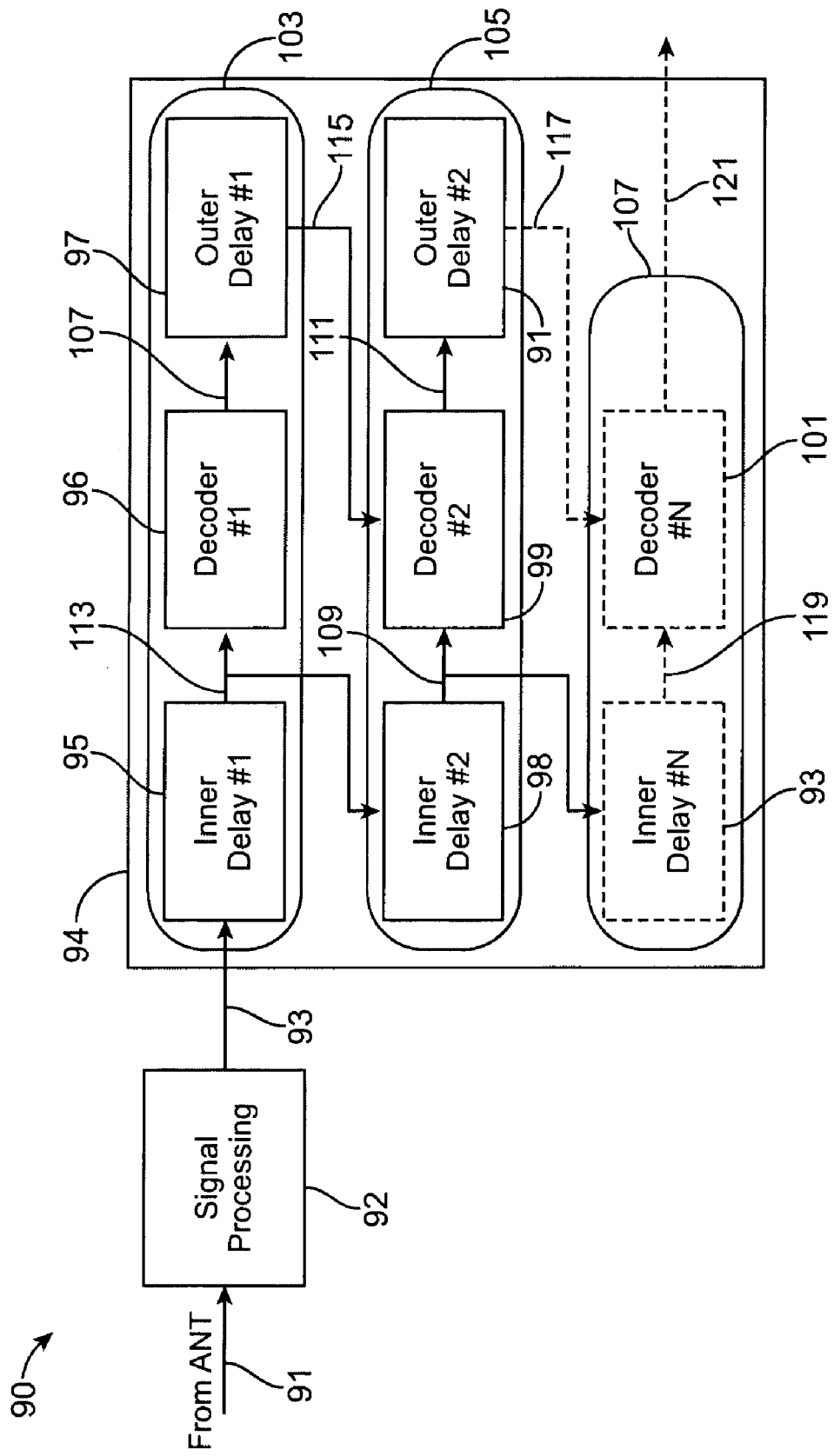

FIG. 12 shows a receiver 90 to include a signal processing circuit 92, receiving an input 91 from an antenna, and coupled to a modified iterative decoder circuit 94, in accordance with another embodiment of the present invention.

Figure 13:
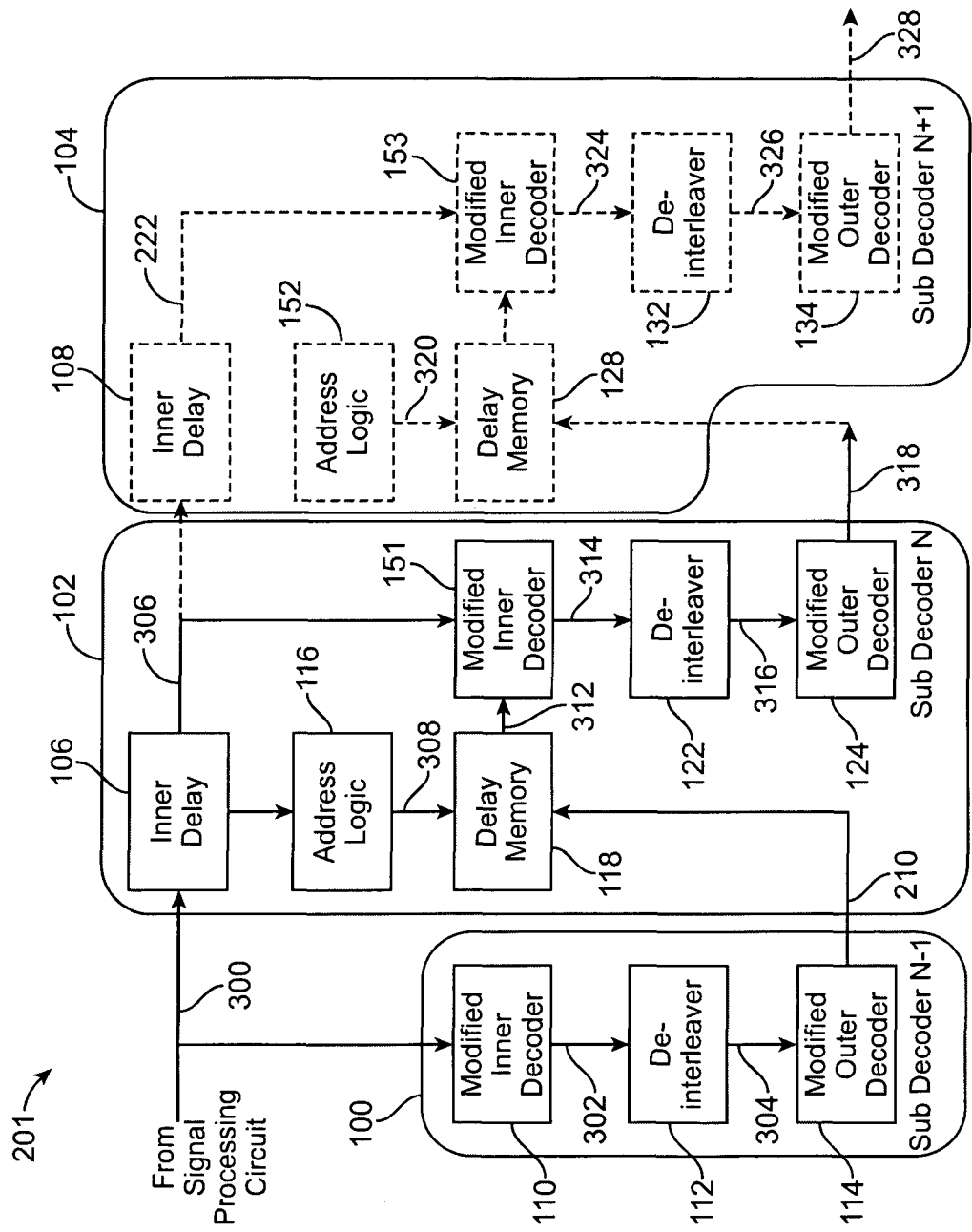

FIG. 13 shows a three-stage receiver 201, including stages N−1, N and N+1, in accordance with an embodiment of the present invention.

Figure 14:
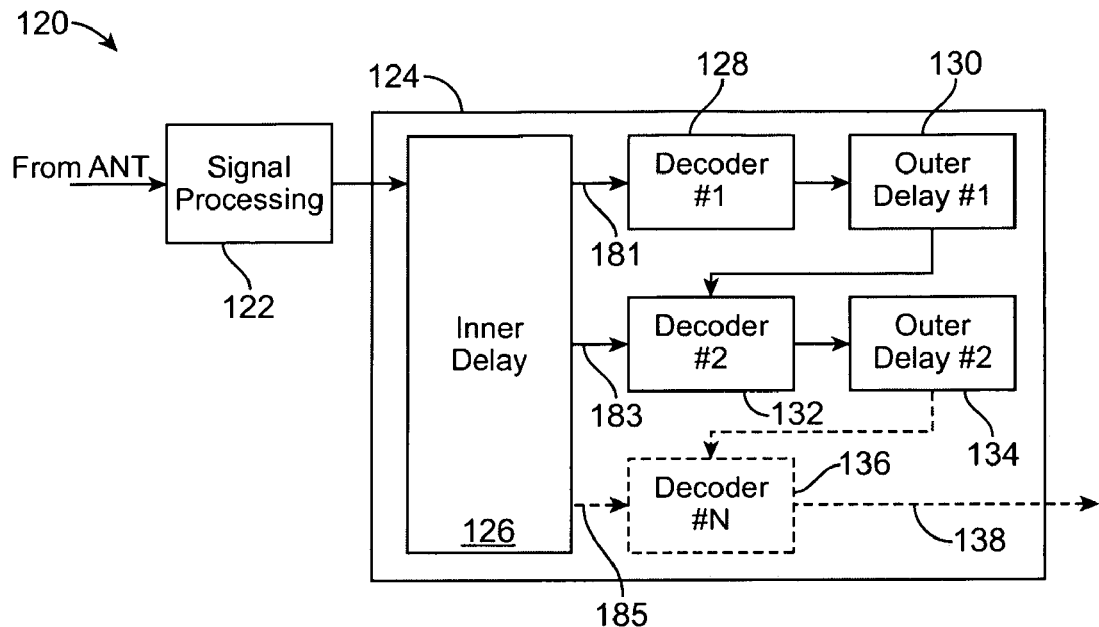

FIG. 14 shows a receiver 120 in accordance with another embodiment of the present invention.

Figure 15:
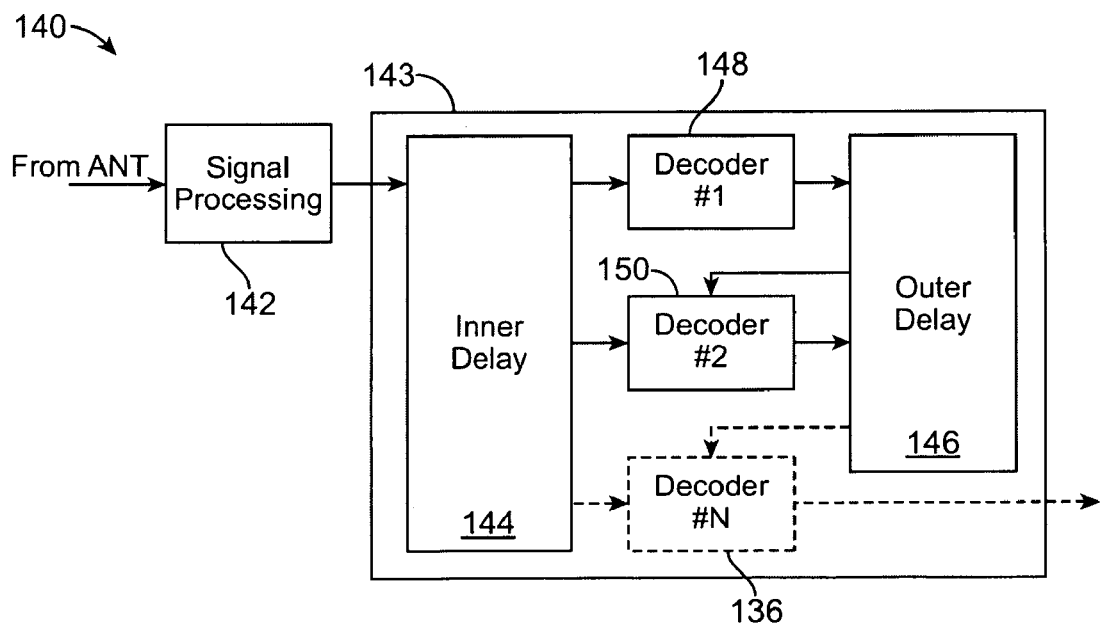

FIG. 15 shows a receiver 140 in accordance with yet another embodiment of the present invention.

Figure 16:
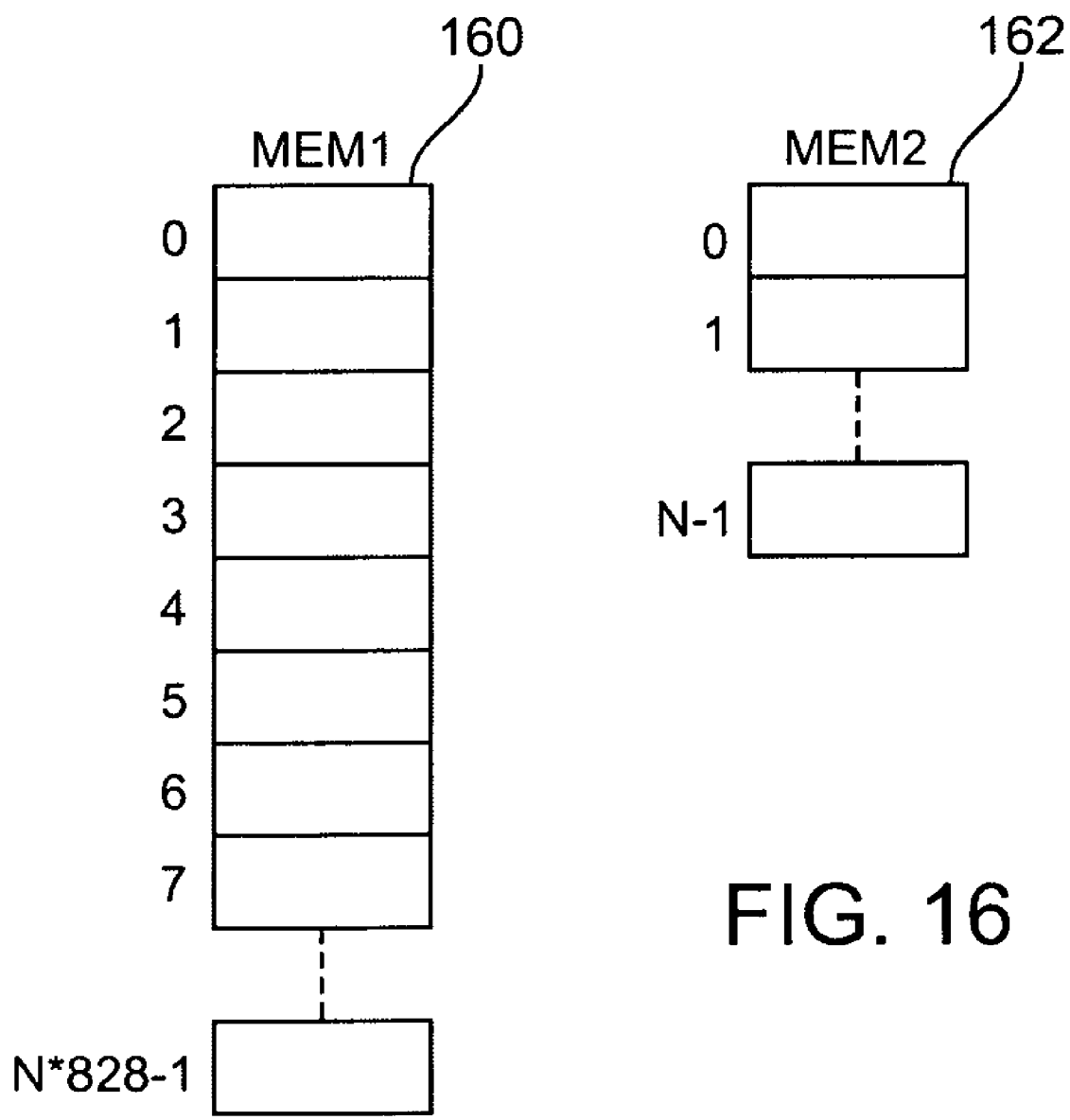

FIG. 16 shows an embodiment of the outer delay of the modified decoders of the single signal processing circuit embodiments of the present invention for the exemplary ATSC A/53 application.

Figure 17:
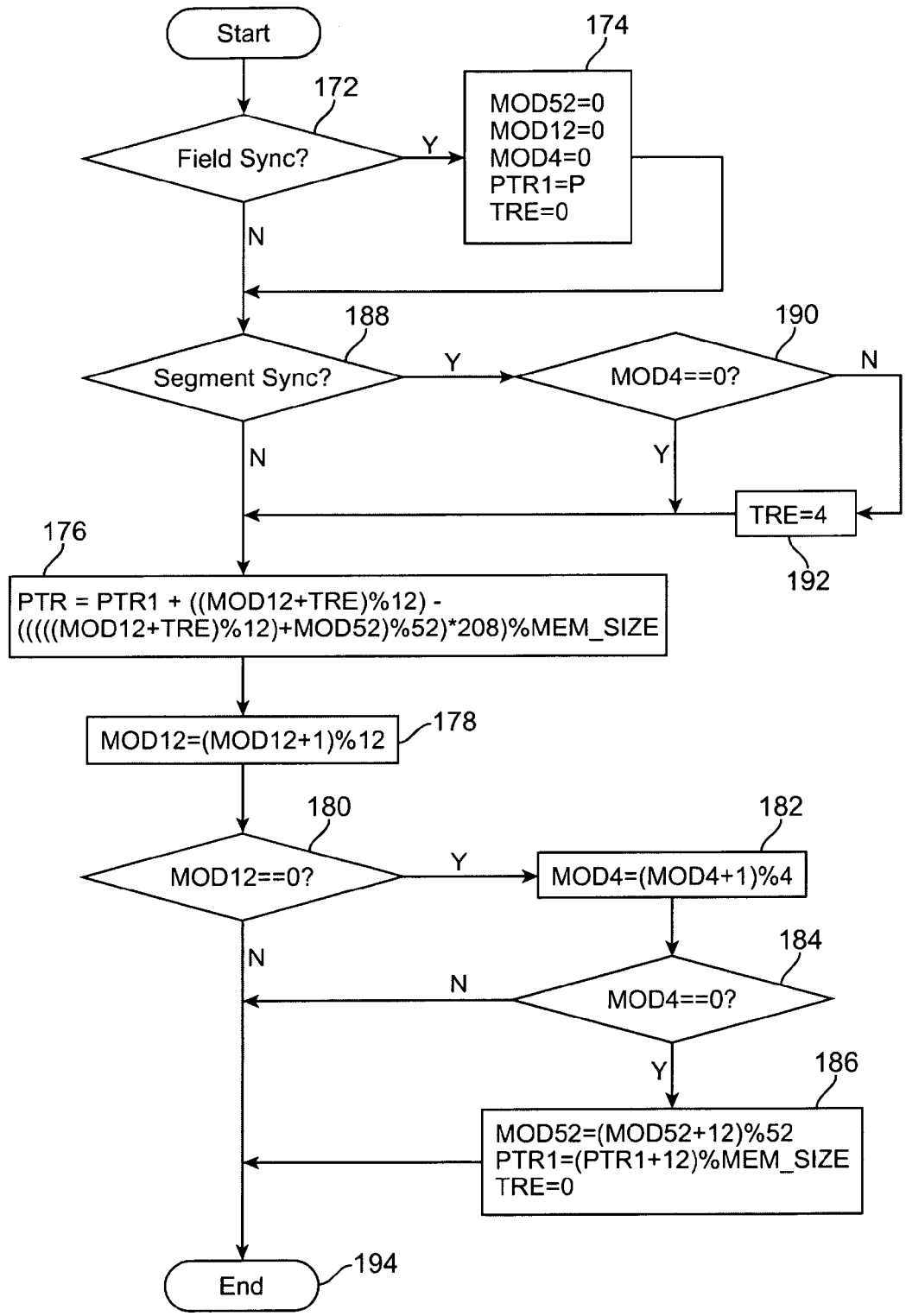

FIG. 17 shows a flowchart illustrating the steps performed by the address logic 70 used to read out $X_1$ bits for use by the modified inner decoder 62.

DETAILED DESCRIPTION OF THE PREFERRED EMBODIMENTS

To overcome the limitations in the prior art described above, and to overcome other limitations that will become apparent upon reading and understanding the present specification, the present invention discloses an apparatus and method for decoding a signal received from an antenna or from multiple antennas using iterative decoding techniques to cause reduced bit-error rate at low signal to noise ratios while reducing memory requirements. Noise, as used herein, refers to undesirable data or data that is not supposed to be a part of the signal that was transmitted and sought to be received, rather it is without meaning.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of embodiments of the present invention.

Figure 1:
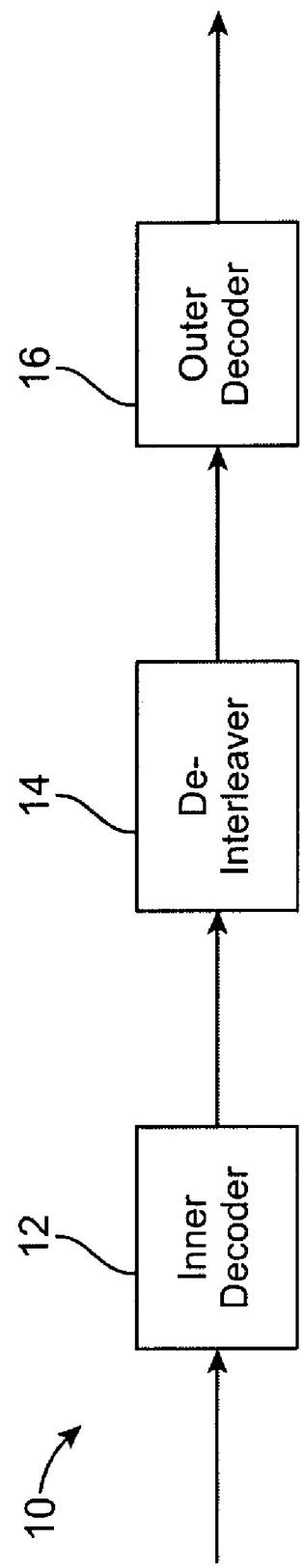
FIG. 1 shows a prior art receiver 10.
Figure 2:
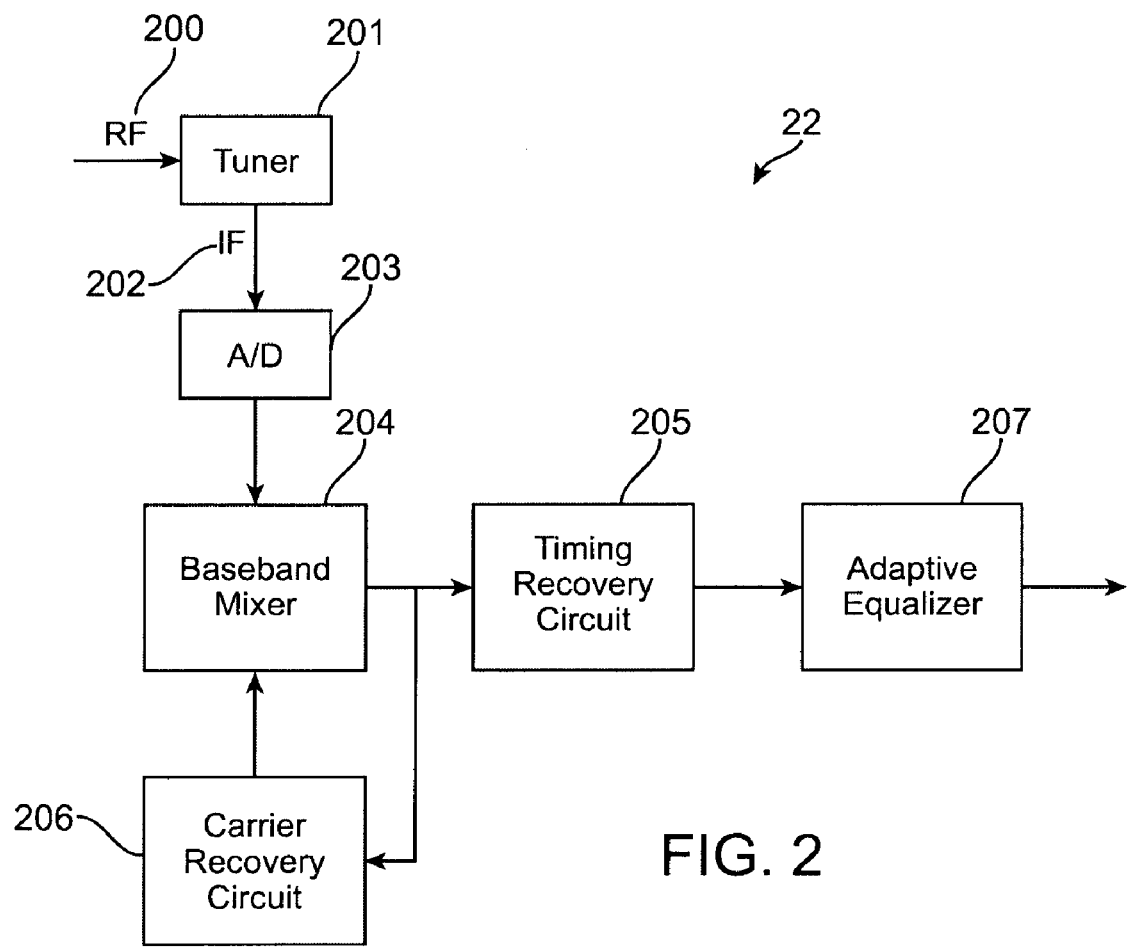
FIG. 2 shows a signal processing circuit 22.

FIG. 2 shows a signal processing circuit 22, which receives digital terrestrial television signals broadcast according to the Advanced Television Systems Committee (ATSC) standard A/53. In FIG. 2, a signal processing circuit 22 is shown to include a tuner 201, an analog-to-digital (A/D) converter 203, a baseband mixer 204, a carrier recovery circuit 206, a timing recovery circuit 205, and an adaptive equalizer 207. The tuner receives radio frequency (RF) input 200 and provides an intermediate frequency (IF) signal 202 to the A/D converter 203, to which it is coupled. A/D converter 203 is coupled to both the tuner 201 and the baseband mixer 204. The A/D converter 203 samples the analog IF signal at a rate not synchronized to a remote transmitter to produce a digital IF signal. The digital IF is then passed to the baseband mixer 204. The baseband mixer 204 down-converts the digital IF signal to baseband and passes the down-converted baseband signal to the timing recovery circuit 205, to which it is coupled. The baseband mixer 204 is coupled to the A/D converter 203, the timing recovery circuit 205, and the carrier recovery circuit 206. The carrier recovery circuit 206 is coupled to the baseband mixer 204 and the timing recovery circuit 205. The carrier recovery circuit serves to synchronize the baseband mixer to the IF carrier frequency. The timing recovery circuit 205 is coupled to the baseband mixer 204 and the equalizer 207, and serves to resample the down-converted baseband signal at a rate synchronized to the remote transmitter. The timing recovery circuit 205 automatically updates its re-sampling rate to maintain synchronization with the remote transmitter. The adaptive equalizer 207 is coupled to the timing recovery circuit 205 and is the final processing step before the signal exits the signal processing circuit 22 en route to the iterative decoder circuit 24. The adaptive equalizer 207 removes multi-path distortion and other forms of inter-symbol interference (ISI) from the signal. U.S. patent application Ser. No. 11/650,226, filed on Jan. 5, 2007 and entitled "DYNAMIC MULTI-PATH DETECTION DEVICE AND METHOD", the disclosure of which is herein incorporated by reference as though set forth in full, provides further details of the signal processing circuit 22.

In an alternative embodiment of signal processing circuit 22, the A/D sampling rate is synchronized to the remote transmitter. This embodiment eliminates the need for timing recovery circuit 205. Further alternative embodiments include an Automatic Gain Control (AGC), digital filters, and various synchronization circuits. In alternative embodiments, different communication systems and different signal processing configurations are contemplated. While an embodiment of signal processing circuit 22 has been disclosed herein, it is appreciated that other embodiments are contemplated by those skilled in the art.

Figure 3:
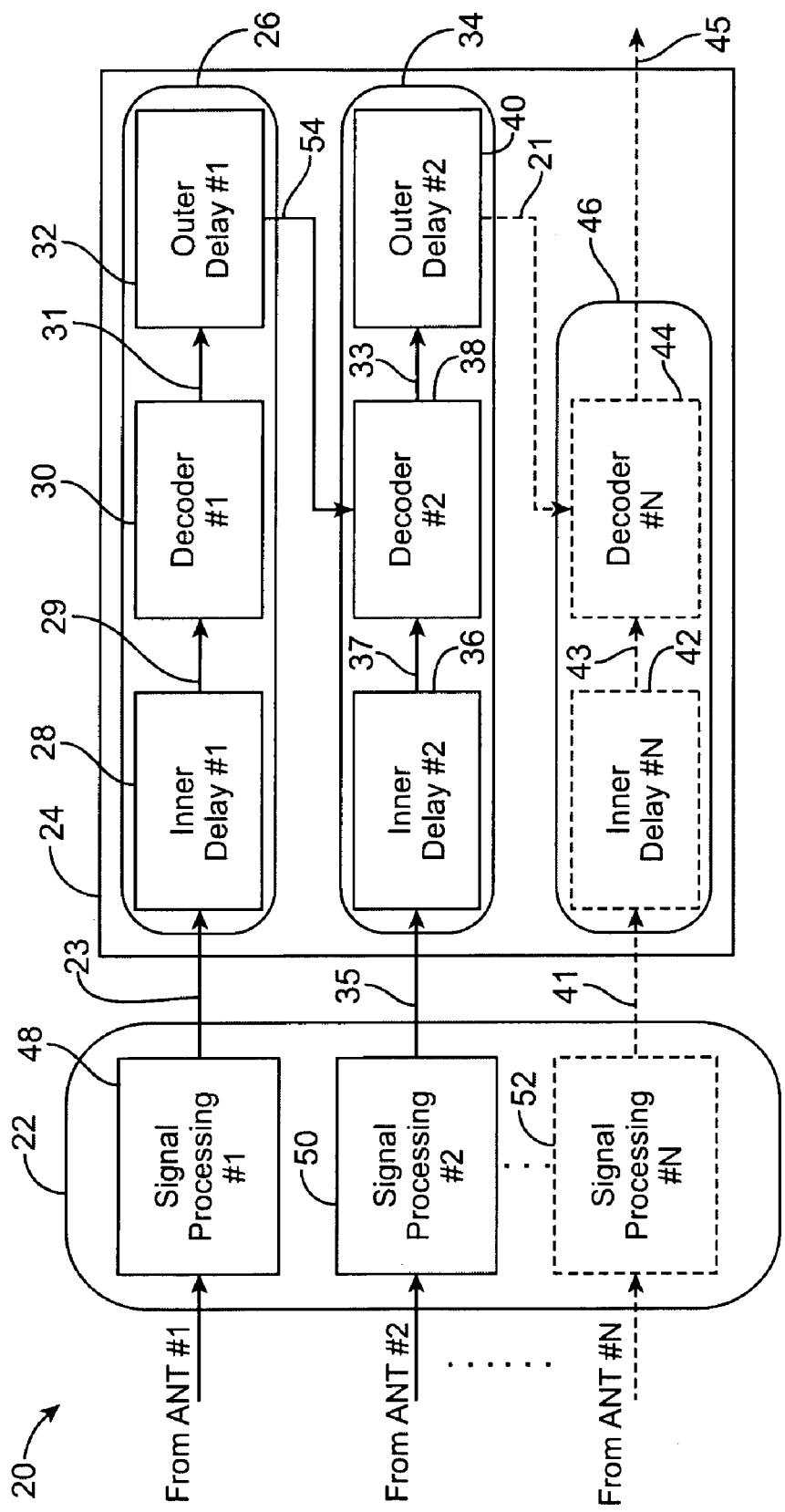
FIG. 3 shows a receiver 20, in accordance with an embodiment of the present invention.

Referring now to FIG. 3, a receiver 20 is shown to include a plurality of signal processing circuits 22, each receiving an input from a respective antenna, coupled to a modified iterative decoder circuit 24, in accordance with an embodiment of the present invention. The iterative decoder circuit 24 functions as a diversity combiner.

The plurality of signal processing circuits 22 is shown to include N number of signal processing circuits 48-52, N being an integer number. Each signal processing circuit is shown to receive an input from a corresponding antenna. For example, the first signal processing circuit 48 is shown to receive its input from an antenna ANT #1 and the second signal processing circuit 50 is shown to receive its input from the antenna ANT #2 and the Nth signal processing circuit 52 is shown to receive its input from the antenna ANT #N and so on. As shown, any number of antennas may be used to receive the signal therefrom and a corresponding number of signal processing circuits are used to receive the signal from a corresponding antenna. It is also contemplated that one or more of the N signal processing circuits may themselves have multiple antenna inputs and perform a first level of diversity combining using maximal ratio combining or other techniques. For the purposes of this invention, the output of a single signal processing circuit with multiple antenna inputs is treated the same as that of a single signal processing circuit with a single antenna input. For purposes of simplification in this specification, the signal processing circuits are illustrated and described as having single antenna inputs. However, as appreciated by those skilled in the art, in alternative embodiments of the present invention any or all of the signal processing circuits may have multiple antenna inputs.

Each of the signal processing circuits 22 serves to convert its received signal from a radio frequency (RF) signal to a digital baseband signal suitable for decoding by the iterative decoder circuit. The signal received by each of the signal processing circuits is typically interleaved due to the nature of the coding technique employed and must then be de-interleaved by the receiver 20. Each of the signal processing circuits 22 generates a digital baseband signal for decoding by the iterative decoder circuit 24.

In FIG. 3, the iterative decoder circuit 24 is shown to include N number of sub-decoders, each sub-decoder 26, 34 and 46, being coupled to receive input from a respective signal processing circuit 22. For example, the sub-decoder 26 is shown to receive input from the signal processing circuit 48 and the sub-decoder 34 is shown to receive input from the signal processing circuit 50 and the sub-decoder 46 is shown to receive its input from the signal processing circuit 52.

Each of the signal processing circuits 22 generates a baseband signal provided to a corresponding inner delay of a corresponding sub-decoder. For example, the output of the signal processing circuit 48 is a baseband signal 23 provided to the inner delay 28 of the sub-decoder 26. Similarly, the output of the signal processing circuit 50 is a baseband signal 35 that is provided as input to the inner delay 36 of the sub-decoder 34 and the output of the signal processing circuit 52 is a baseband signal 41 provided as input to the inner delay 42 of the sub-decoder 46.

Each of the inner delays of the N sub-decoders generates and provides an inner delay signal to a modified decoder to which it is coupled. For example, the inner delay 28 is shown to generate an inner delay signal 29 and to provide the same to the modified decoder 30. The inner delay 36 is shown to generate the inner delay signal 37 and to provide the same to the modified decoder 38 and the inner delay 42 is shown to generate the inner delay signal 43 and to provide the same to the modified decoder 44, which is shown to provide the output signal 45, which is the signal sought to be decoded. The inner delay signals 29, 37, and 43 have fixed delays relative to the baseband signals 23, 35, and 41, respectively. Optionally, the fixed delay of inner delay signal 29 can be set to zero, thereby removing inner delay 28 from the iterative decoder circuit 20.

Each of the modified decoders of N−1 of the N sub-decoders generates a set partition signal and provides the same to an outer delay to which it is coupled. Stated differently, each of the modified decoders of the N sub-decoders, except the last one or the Nth modified decoder, generates a set partition signal.

The set partition signals 31 and 33 are delayed by a variable delay to generate delayed set partition signals 54 and 21, which are used to eliminate some symbols from consideration by a subsequent sub-decoder. If reliable set partition information is not available due to a failure in the sub-decoder, then such failure is indicated in the set partition signal.

Stated specifically with reference to the embodiment of FIG. 3, the modified decoder 30 is shown to generate a set partition signal 31 and to provide the same to the outer delay 32. The modified decoder 38 is shown to generate a set partition signal 33 and to provide the same to the outer delay 40. The set partition signal 33 of the sub-decoder 34 has a lower probability of errors than the set partition signal 31 of the sub-decoder 26 because each modified decoder has the ability to remove additional errors from the signal having the benefit of the outcome of a previous sub-decoder. Stated differently, in the various embodiments of the invention, such as that of FIGS. 3, 12, 14 and 15, errors in some of the set partition signals are corrected relative to preceding set partition signals. Accordingly, the overall probably of error, or in the embodiment of FIG. 3, the probably of error in the signal 45, is advantageously reduced with lower manufacturing costs per sub-decoder than prior art iterative decoding techniques.

Reliability, as used herein, describes a set partition signal with the fewest errors. In one embodiment of the present invention, reliability describes a very low probability (on the order of 1e-10 or less) of containing errors. For example, a Reed-Solomon (RS) (207,187) codeword such as used in the ATSC A/53 system is reliable if no uncorrectable errors are detected by an errors-only RS decoder (i.e., an RS decoder that has no a priori error location information).

In an alternative embodiment of the present invention, in which an error-and-erasures RS decoder (i.e., an RS decoder that uses a priori error location information) is used, codewords with no uncorrectable errors detected are not necessarily reliable, because some combinations of error and erasures counts have high probability of false decoding. The false decoding probability must be taken into account when deciding whether the codeword is reliable or unreliable after error correction.

The first modified decoder, or the modified decoder 30 of FIG. 3, generates the least reliable set partition signal (with the highest probability of errors). The second modified decoder or the modified decoder 38 generates a set partition signal with lower probability of errors than the decoder 30 but greater probability of errors than the set partition signals of subsequent sub-decoders and so on.

The outer delays of each of the N−1 of the N sub-decoders are responsive to a corresponding set partition signal and operate to generate a delayed set partition signal to a modified decoder of a subsequent sub-decoder. For example, in FIG. 3, the outer delay 32 of the sub-decoder 26 is shown to receive the set partition signal 31 and to generate a delayed set partition signal 54 and to provide the same to the modified decoder 38 of the sub-decoder 34.

The outer delay 40 of the sub-decoder 34 is shown to receive the set partition signal 33 and to generate a delayed set partition signal 21 and to provide the same to the modified decoder 44 of the sub-decoder 46. The delayed set partition signals 54 and 21 have variable delay relative to the set partition signals 31 and 33. The variable delay is controlled by address logic in the outer delay circuit, described below.

Each of the N inner delays 28, 36 and 42 of the embodiment of FIG. 3 is a conventional delay line, well known in the art. Each inner delay may include a single delay line or a combination of several smaller delay lines. Each of the inner delays causes its baseband signal input to be delayed by a predetermined (or fixed) period of time before being provided to a modified decoder to which the inner delay is coupled.

In one embodiment of the present invention, the fixed delay may be designed to compensate for the worst-case delay of a sub-decoder. For signals transmitted according to ATSC A/53, a fixed delay that compensates the worst-case sub-decoder delay is 43884 symbols.

In yet another embodiment, a larger delay may be chosen to compensate longer processing delays. In still further embodiments, a shorter delay that does not compensate the worst-case sub-decoder delay may be chosen. However, when using such a delay the set partition signals will sometimes not be available in time for use by subsequent sub-decoders, and therefore must be treated as unreliable by the subsequent sub-decoders.

Each of the N−1 outer delays 32 and 40 of the embodiment of FIG. 3 is more complex than the inner delays, due to the de-interleaving process within the modified decoders, discussed in further detail shortly. Further details of an exemplary outer delay are provided and discussed relative to FIGS. 9 and 11.

In an exemplary application, the receiver 20 is used in a wireless communication system and the signals being input to the signal processing circuits 22 are digital terrestrial television signals such as those defined by the known standard A/53, adopted by the Advanced Television Systems Committee (ATSC). Such an application is further discussed below.

In operation, the receiver 20 receives a signal through its N number of antennas and each of the N antennas provides the received signal to a corresponding one of the signal processing circuits 22, which then process the received signal and provide baseband signals to an inner delay 28, 36, 42 of the corresponding sub-decoder 26, 34, 46. The inner delays delay the baseband signal by an amount determined by the worst-case processing delay of a sub-decoder, and the desired tradeoff between memory size and availability of reliable set partition signals. The baseband signal, as delayed by the inner delay, is then provided to a corresponding modified decoder that serves to generate the set partition signal, such as the signals 31 or 33, which serves to provide sufficient information for the subsequent sub-decoder to eliminate some constellation points from consideration at a given symbol interval. In one embodiment of the present invention, the set partition signal consists of two sub-signals. The first sub-signal contains set partition information for each received symbol, where said information may or may not be reliable. The second sub-signal contains a reliability indicator for a block of received symbols. For signals transmitted in accordance with ATSC A/53, a reliability indicator is generated for each block of 828 symbols, corresponding to a Reed-Solomon codeword of 207 bytes. In summary, the set partition outputs of each sub-decoder have greater than or equal reliability than those of previous sub-decoders.

Figure 4:
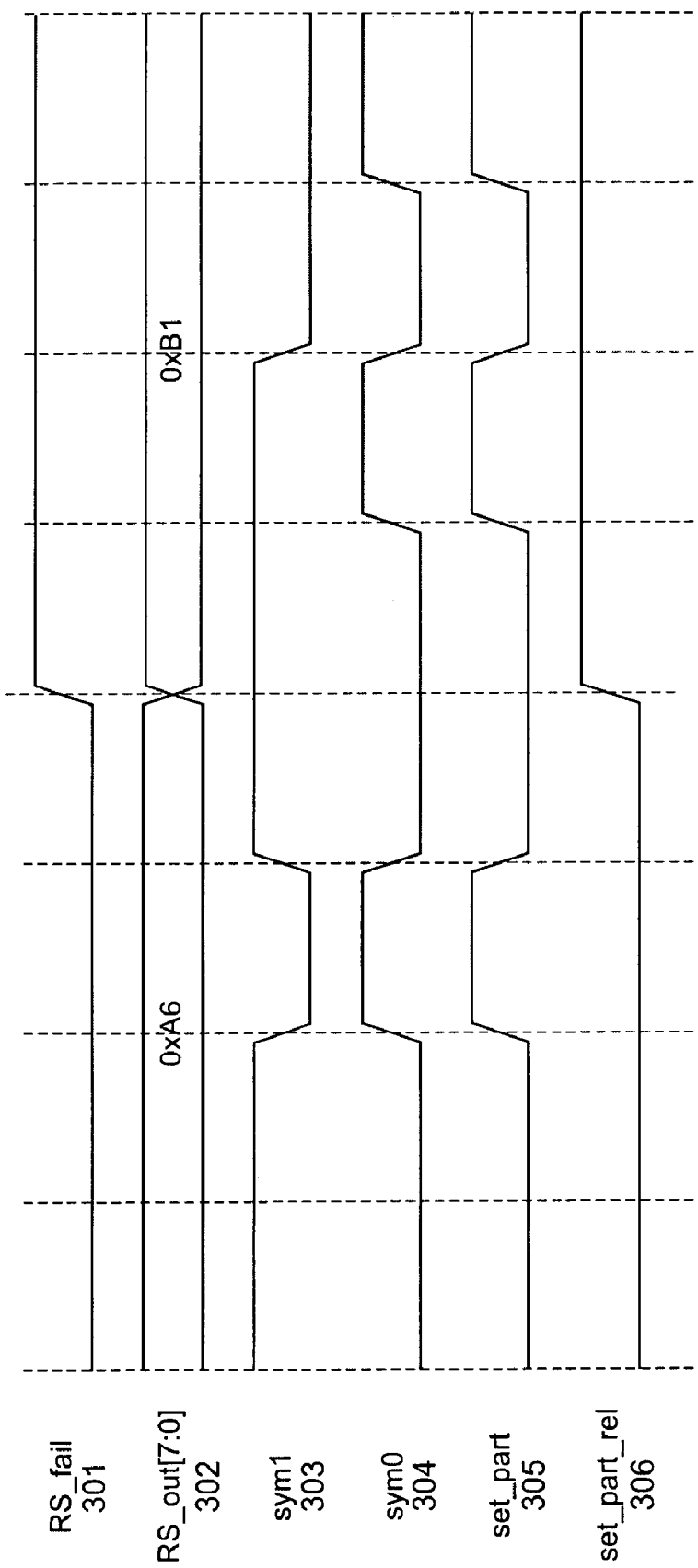
FIG. 4 shows a timing diagram which illustrates how the Reed-Solomon decoder outputs relate to the set partition signals.

FIG. 4 shows a timing diagram which illustrates how the Reed-Solomon decoder outputs relate to the set partition signals. FIG. 4 shows six signals: RS_fail 301, RS_out[7:0] 302, sym1 303, sym0 304, set_part 305, set_part_rel 306. RS_fail 301 is a 1-bit signal. Signal 301 is set to 1 when the RS decoder detects uncorrectable errors. RS_out[7:0] 302 is the 8-bit output bytes of the RS decoder. Sym1 303 is the most significant bit of symbol data (X2 in ATSC A/53 Part 2 FIG. 6.8 of FIG. 6). Sym0 304 is the least significant bit of symbol data (X1 in ATSC A/53 Part 2 FIG. 6.8 of FIG. 6). Set_part 305 is the set partition signal, equal to sym0 304. Set_part_rel 306 is the set partition reliability signal, equal to RS_fail 301. In this case, binary '1' indicates an unreliable set partition signal. The signals set_part 305 and set_part_rel 306 get stored in the outer delay memory, which is discussed in further detail in FIG. 14.

Shown in FIG. 4 is a sample scenario in which the first byte labeled '0xA6' is the last byte of a first Reed-Solomon codeword that has been decoded reliably (no uncorrectable errors were detected), but the second byte labeled '0xB1' is the first byte of a second Reed-Solomon codeword that could not be decoded reliably (uncorrectable errors were detected). The levels of sym1 and sym0 are derived by dividing the 8-bit bytes into 2-bit symbols, starting with the most significant bit.

Figure 5:
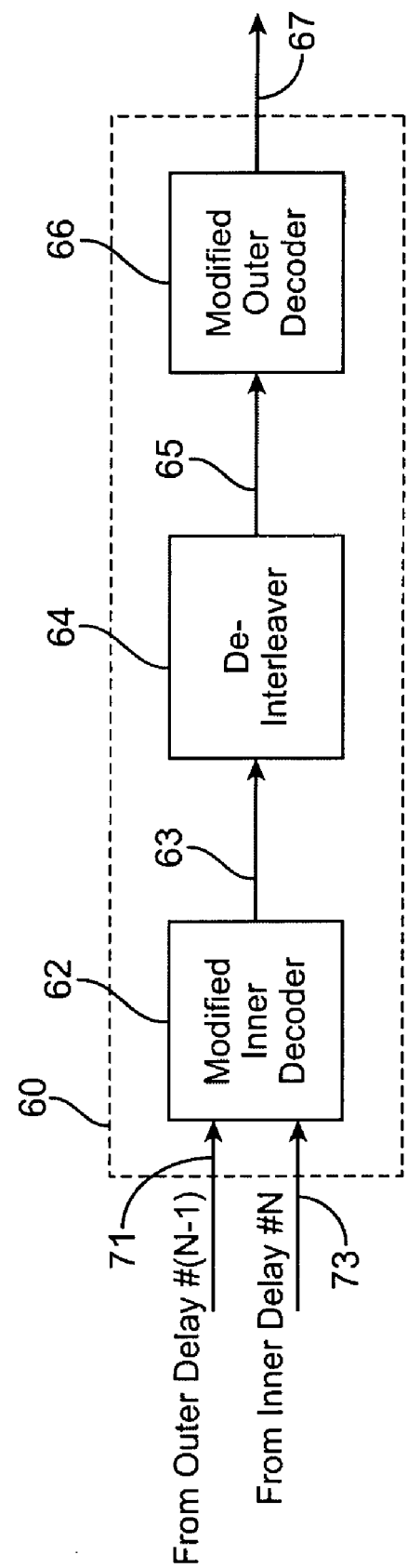
FIG. 5 shows further details of each of the N modified decoders, in accordance with an embodiment of the present invention.

FIG. 5 shows further details of each of the N modified decoders, in accordance with an embodiment of the present invention. In FIG. 5, a modified decoder 60 is shown to include a modified inner decoder 62, which is shown coupled to a de-interleaver 64, which is shown coupled to a modified outer decoder 66. The modified decoder 60 is the same as modified decoder 38. For the sake of clarity, the modified decoder 60 will be explained as if it is the modified decoder 38, which is within the 2nd sub-decoder 34.

The modified outer decoder 66 provides a set partition signal for a subsequent inner decoder. The set partition signal causes the subsequent inner decoder to eliminate at least one constellation point from consideration at a given symbol interval. The set partition signal is derived from the error-corrected output of the outer decoder, based on a determination of the possible constellation points that could have been generated at the transmitter given that the input to the transmitter's inner encoder is equal to the error-corrected output of the outer decoder.

The modified inner decoder 62 is shown responsive to a delayed set partition signal 71. It is noted that in this case signal 71 is the same as signal 54. The modified inner decoder 62 is further shown responsive to the inner delay signal 73, which is the same as the signal 37 in this case. The modified inner decoder 62 is operative to generate a modified inner decoder signal 63 and to provide the same to the de-interleaver 64. The de-interleaver 64 is shown to be responsive to the modified inner decoder signal 63 and operative to generate a de-interleaved signal 65 and to provide the same to the modified outer decoder 66. The modified outer decoder 66 is shown to be responsive to the de-interleaved signal 65 and operative to generate a set partition signal 67, which is the same as the signal 21 in this case. In the case where the decoder 60 is within the first sub-decoder 26 there is no delayed set partition signal 71, and a conventional inner decoder can be used. In the case where the decoder 60 is within the last sub-decoder 46, signal 67 is the signal sought 45, and a conventional outer decoder can be used.

The modified inner decoder 62 serves to decode the inner code has been applied to the signal by the transmitter prior to being received from a corresponding antenna, given the knowledge that some symbols have been eliminated from consideration by the set partition signal. In an exemplary embodiment of the present invention using the ATSC A/53 standard, the inner code is a trellis code, and the modified inner decoder consists of 12 parallel trellis decoders, each performing a Viterbi algorithm to determine the best sequence of received symbols, subject to the elimination of some symbols by the set partition signal. The de-interleaver 64 is a conventional de-interleaver, and serves to de-interleave the received signal or to remove the interleaved effect introduced into the signal prior to transmission thereof. In an exemplary embodiment of the present invention, the de-interleaver 64 consists of two parts: a convolutional de-interleaver operating on 8-bit data bytes and a trellis code de-interleaver operating on 2-bit data symbols.

The modified outer decoder 66 serves to decode the outer code applied to the signal prior to transmission, further generating a set partition signal for use by a subsequent modified inner decoder. In an exemplary embodiment of the present invention using the ATSC A/53 standard, the modified outer decoder is a Reed-Solomon decoder, operating to correct errors in the received data bytes, and to output a set partition signal 67 derived from the error-corrected data bytes. The set partition signal 67 consists of two sub signals: the first sub-signal contains set partition information for each received symbol, consisting of the X1 and X2 bits defined in A/53, wherein there are 4 X1 bits and 4 X2 bits for each error corrected data byte. The set partition information contained in the first sub-signal may or may not be reliable. The second sub-signal contains reliability information, consisting of a 1 bit pass/fail signal for each block of 828 symbols, representing one 207-byte Reed-Solomon codeword. The Reed-Solomon decoder fails if it detects uncorrectable errors in the codeword. It passes if the number of errors in the codeword is less than or equal to its error correction ability.

Figure 6:
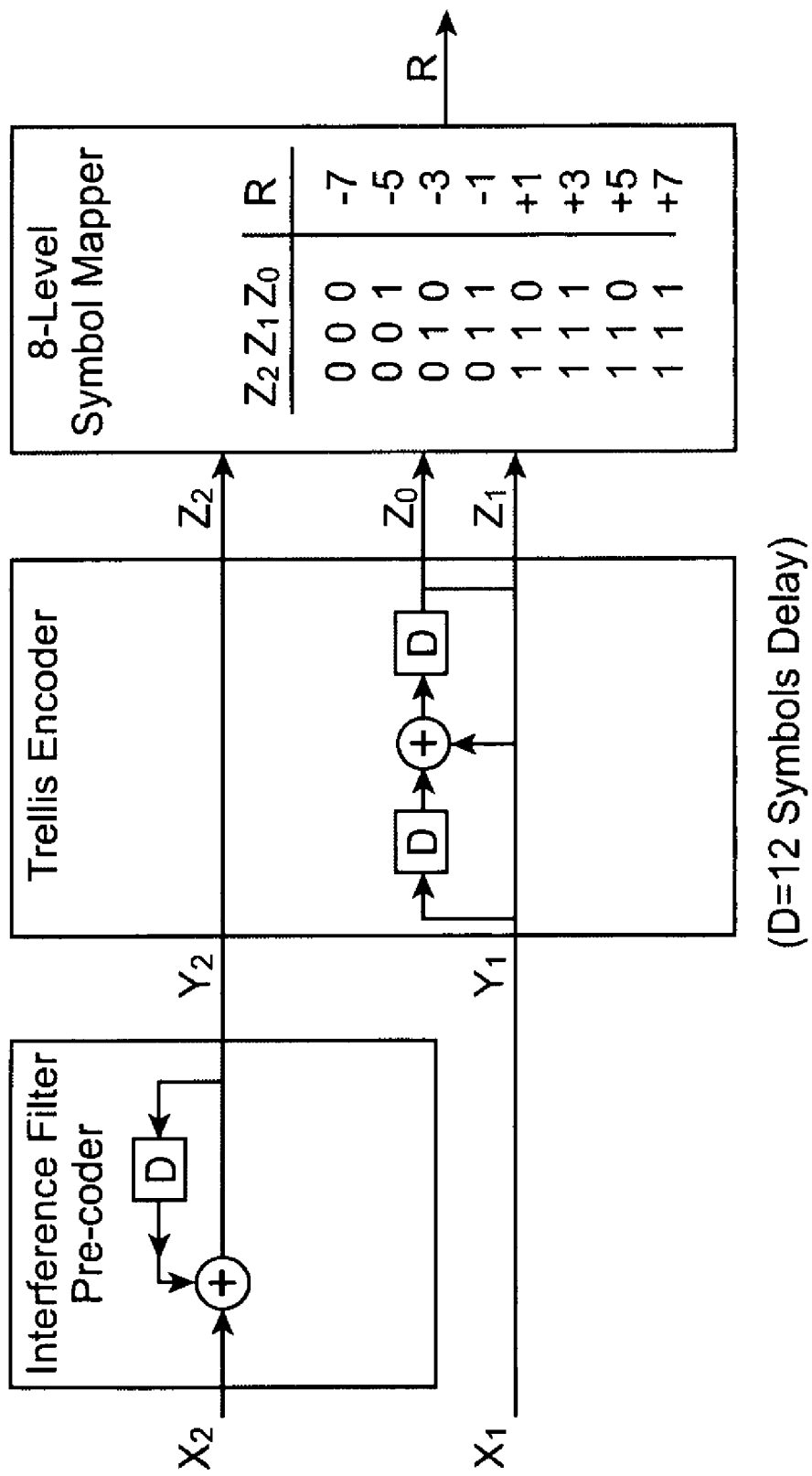
FIG. 6 shows FIG. 6.8 of the ATSC A/53 standard for a better understanding of the application of the embodiments of the present invention thereto.

Conventional inner decoders that are in compliance with the ATSC A/53 standard generally employ the Viterbi algorithm to decode the trellis code. In a conventional inner decoder, a coset slicer receives input in the form of a baseband signal. This baseband signal is typically the output of a signal processing circuit, which includes an equalizer. The ATSC A/53 standard, published on the website http://www.atsc.org/standards/a53-Part-2-2007.pdf, defines 8 symbol levels used for transmission. FIG. 6 shows an inner trellis encoder employing the ATSC A/53 standard for a better understanding of the application of the embodiments of the present invention thereto. As shown in FIG. 6, at each symbol interval in the transmitter, 3 bits (Z2, Z1, and Z0) are used to select one of the 8 symbols, wherein the 3 bits are outputs of the inner encoder.

Figure 7:
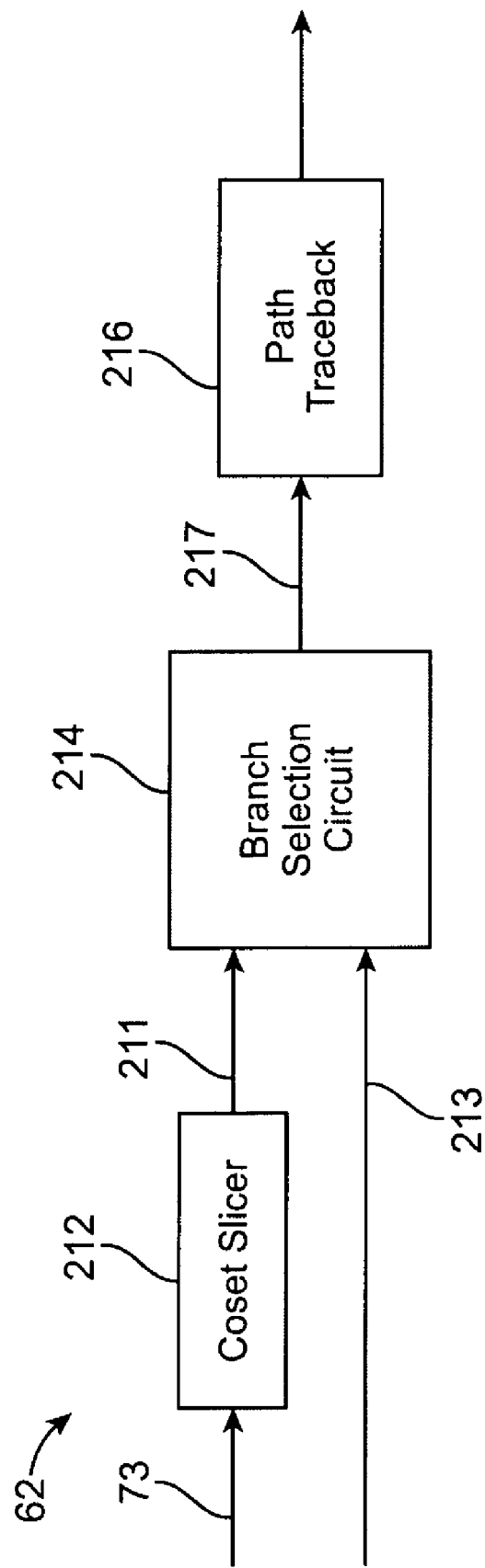
FIG. 7 shows further details of the modified inner decoder 62.

Further details of the modified inner decoder 62 are shown in FIG. 7. The modified inner decoder 62 is shown to include a coset slicer 212, coupled to a branch selection circuit 214 and a path traceback circuit 216 coupled to the circuit 214. The coset slicer 212 is shown to receive the inner delayed signal 73 and is operative to generate coset decisions with associated branch metrics 211, which are provided as input to the circuit 214. The circuit 214 is further shown to receive the delayed set partition input signal 213 that is from a previous outer delay. Based on these inputs, the branch selection circuit 214 is operative to choose the best trellis branch coming into each of the possible trellis states and generate output signal 217. Output signal 217 is received by path traceback circuit 216. In a preferred embodiment, a 4-state trellis decoder is used to decode the inner code defined in ATSC A/53. The branch selection circuit 214 maintains a history of state transitions to be used by the path traceback circuit 216, which is operative to generate the modified inner decoder signal 63.

The coset slicer 212, as well known to those skilled in the art, serves to detect the nearest constellation level in one or more cosets of the transmitted constellation to the received symbol. The distance(s) from the received symbol(s) to the nearest constellation level(s) is (are) used to compute the associated branch metric(s). The absolute value or square value of the distance is typically used for metric generation.

The circuit 214 is operative to use the branch metrics to determine the best branch for each state of the trellis code, well suited for decoding the received signal and to store coset decisions for the best branches and to accumulate path metrics for each state.

The modified inner decoder 62 differs from a conventional inner decoder by an addition of the delayed set partition input 213 to the branch selection circuit 214. The delayed set partition input signal 213 consists of set partition information and set partition reliability information. In the modified inner decoder 62, both the coset decisions with associated branch metrics 211 and the set partition input 213 are used to select the best receive symbol and associated trellis branch for each state thereby advantageously improving the selection of the trellis branch for each state. The modified inner decoder utilizes its prior knowledge of some input symbols in order to choose the correct trellis branches more often than a conventional inner decoder. In a conventional inner decoder, the selection circuit uses only the coset decisions with associated branch metrics to select the best trellis branch for each state.

It is noted that there may be more than one de-interleaver between the inner and outer decoders 62 and 66. In the case where the application of the decoder of the various embodiments of the present invention receives A/53 signals, the decoder has two de-interleavers: a convolutional byte de-interleaver and a trellis code de-interleaver.

In an embodiment of the present invention, the set partition outputs of the modified outer decoder are stored in memory in the order they are generated. This is a different order than is needed for the input to the subsequent modified inner decoder, due to the effect of the de-interleaver(s). An address logic, shown and discussed relative to subsequent figures, generates a sequence of pointers so that the modified inner decoder inputs are in the right order.

Table 1 illustrates the logical differences between the conventional inner decoder and the modified inner decoder. In Table 1 "Current State" represents the bits stored in the trellis decoder delay elements, and are expressed in binary notation. The "Set partition information bits" are the outputs of a previous modified outer decoder, and consist of the X1 and X2 bits corresponding to the current receive symbol which are expressed in binary notation as X2X1. The "Set partition reliability bit" is also an output of the same previous modified outer decoder, and consists of a pass/fail bit indicating whether the Reed-Solomon codeword associated with the current receive symbol was decoded successfully or not. The "Set partition reliability bit" is shown to be a "1" to indicate unreliable, and "0" to indicate reliable. "Possible symbols (conventional)" lists the possible symbols available for selection in the conventional inner decoder. "Possible symbols (modified)" is a list of possible symbols available for selection in the modified inner decoder. For both the conventional and the modified inner decoders, the possible symbol with the best metric from the coset slicer is chosen by the branch election circuit. In the various embodiments of the present invention, the modified inner decoder 62 advantageously limits its set of possible symbols, reducing the chance of incorrect symbol decisions, thus allowing the modified inner decoder 62 to make more correct decisions than the conventional inner decoder.

TABLE 1

| Current State | Set partition information bits (X2X1) | Set partition reliability bit | Possible symbols (conventional) | Possible symbols (modified) |
|---|---|---|---|---|
| 00 | 00 | 0 | −7, −3, +1, +5 | −7 |
| 00 | 00 | 1 | −7, −3, +1, +5 | −7, −3, +1, +5 |
| 00 | 01 | 0 | −7, −3, +1, +5 | −3 |
| 00 | 01 | 1 | −7, −3, +1, +5 | −7, −3, +1, +5 |
| 00 | 10 | 0 | −7, −3, +1, +5 | +1 |
| 00 | 10 | 1 | −7, −3, +1, +5 | −7, −3, +1, +5 |
| 00 | 11 | 0 | −7, −3, +1, +5 | +5 |
| 00 | 11 | 1 | −7, −3, +1, +5 | −7, −3, +1, +5 |
| 01 | 00 | 0 | −7, −3, +1, +5 | −7 |
| 01 | 00 | 1 | −7, −3, +1, +5 | −7, −3, +1, +5 |
| 01 | 01 | 0 | −7, −3, +1, +5 | −3 |
| 01 | 01 | 1 | −7, −3, +1, +5 | −7, −3, +1, +5 |
| 01 | 10 | 0 | −7, −3, +1, +5 | +1 |
| 01 | 10 | 1 | −7, −3, +1, +5 | −7, −3, +1, +5 |
| 01 | 11 | 0 | −7, −3, +1, +5 | +5 |
| 01 | 11 | 1 | −7, −3, +1, +5 | −7, −3, +1, +5 |
| 10 | 00 | 0 | −5, −1, +3, +7 | −5 |
| 10 | 00 | 1 | −5, −1, +3, +7 | −5, −1, +3, +7 |
| 10 | 01 | 0 | −5, −1, +3, +7 | −1 |
| 10 | 01 | 1 | −5, −1, +3, +7 | −5, −1, +3, +7 |
| 10 | 10 | 0 | −5, −1, +3, +7 | +3 |
| 10 | 10 | 1 | −5, −1, +3, +7 | −5, −1, +3, +7 |
| 10 | 11 | 0 | −5, −1, +3, +7 | +7 |
| 10 | 11 | 1 | −5, −1, +3, +7 | −5, −1, +3, +7 |
| 11 | 00 | 0 | −5, −1, +3, +7 | −5 |
| 11 | 00 | 1 | −5, −1, +3, +7 | −5, −1, +3, +7 |
| 11 | 01 | 0 | −5, −1, +3, +7 | −1 |
| 11 | 01 | 1 | −5, −1, +3, +7 | −5, −1, +3, +7 |
| 11 | 10 | 0 | −5, −1, +3, +7 | +3 |
| 11 | 10 | 1 | −5, −1, +3, +7 | −5, −1, +3, +7 |
| 11 | 11 | 0 | −5, −1, +3, +7 | +7 |
| 11 | 11 | 1 | −5, −1, +3, +7 | −5, −1, +3, +7 |

Figure 8:
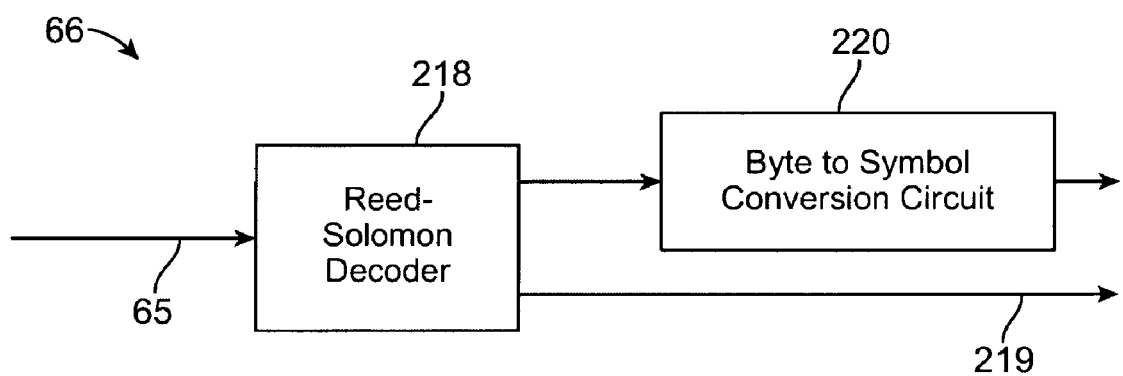
FIG. 8 shows further details of the modified outer decoder 66, in accordance with an embodiment of the present invention.

FIG. 8 shows further details of the modified outer decoder 66, in accordance with an embodiment of the present invention. Modified outer decoder 66 is shown to include the Reed-Solomon decoder 218 and the Byte to Symbol Conversion circuit 220. The decoder 218, which receives the signal 65 is shown coupled to the circuit 220 and provides an output 219. The Reed-Solomon decoder 218 operates on codewords of a fixed number of bytes, where the fixed number is equal to 207 in the ATSC A/53 standard. A certain number of these bytes are data bytes (187 in the ATSC A/53 standard), and the rest are parity bytes (20 in the ATSC A/53 standard) that are added to the data bytes by the Reed-Solomon decoder based on a generator polynomial. Assuming no external information such as soft metrics or erasure indicators are used in the receiver, a Reed-Solomon decoder can correct a number of errors in the codeword up to half of the parity bytes (10 in the ATSC A/53 standard). If there are more errors, the decoding process will fail. Such failure is typically indicated by a pass/fail bit available at the output of the Reed-Solomon decoder. The byte to symbol conversion circuit 220 extracts the set partition information for each symbol from the error corrected output. The set partition information consists of 4 X1 bits and optionally 4×2 bits for every byte of the error-corrected output.

Figure 9:
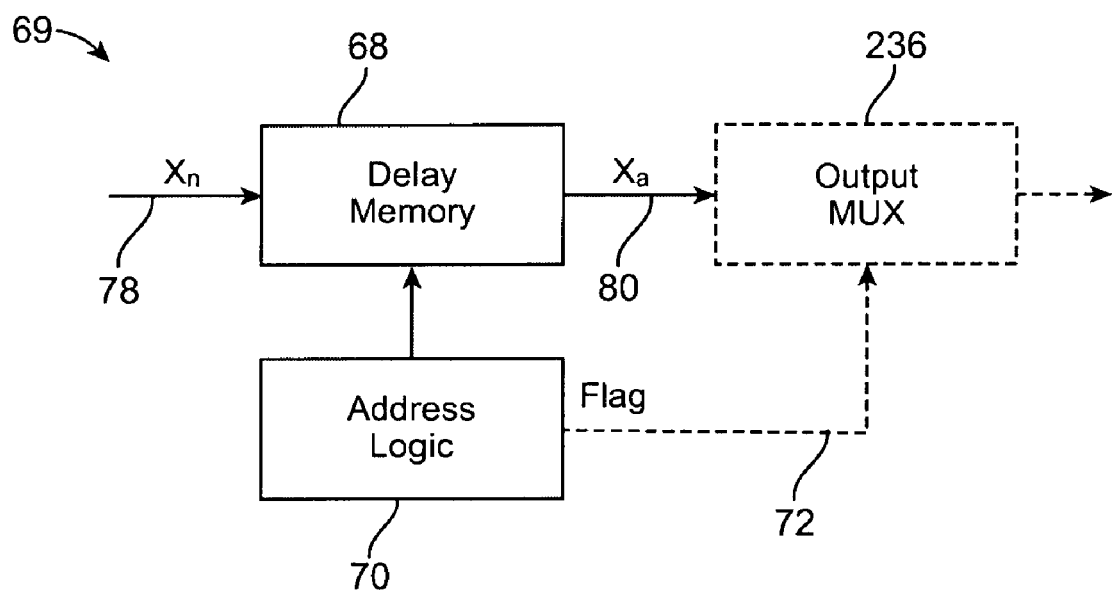
FIG. 9 shows further details of an outer delay, in accordance with an embodiment of the present invention.

FIG. 9 shows further details of an outer delay, in accordance with an embodiment of the present invention. It is understood that all outer delays of the embodiment of FIG. 3 include that which is shown included in the outer delay 69 and function in a similar manner.

The outer delay 69 of FIG. 9 is similar to any one of the N−1 outer delays of FIG. 3, such as the outer delay 32 or 40. The outer delay 69 is shown to include a delay memory 68 responsive to the output of an address logic 70. The delay memory 68 is further shown responsive to a set partition signal 78, represented as Xn. The delay memory 68 is shown to generate a delayed set partition signal 80, represented by Xa. The signal 78 is the same as any one of the signals 31 or 33 and the signal 80 is the same as any one of the signals 54 or 21. Outer delay 69 is further shown to include an optional output multiplexer (mux) 236, responsive to the delayed set partition signal 80 and to an optional flag 72, which is generated by the address logic 70.

The outer delay 69 is shown to include the delay memory 68 coupled to receive the set partition signal 78, represented by Xn, and operative to generate the delayed set partition signal 80. The set partition signal 78 is generated by a modified decoder that is coupled to the outer delay 69, as previously noted. The delay memory 68 is further shown to receive an address logic signal 75 generated by an address logic 70, which is shown coupled to the delay memory 68 through the address logic signal 75. The address logic 70 is further shown to generate an optional flag 72. Flag 72 advantageously indicates that the set partition signal corresponding to the current receive symbol being processed by the modified inner decoder 62 is not yet available. Flag 72 is necessary if the inner delay memory size is smaller than the worst-case delay of a sub-decoder. When Flag 72 is set, the optional output multiplexer (mux) 236 generates a default set partition signal indicating that the set partition information is unreliable. When Flag 72 is not set, the output mux outputs the set partition signal retrieved from memory based on the address logic.

The address logic 70 generally generates a sequence of pointers and compensates the effect of operations between the inner and outer decoders, including de-interleavers and causes the set partition inputs to the subsequent modified inner decoder to be in the correct order, aligned with the delayed symbol inputs.

In operation, a sequence of inputs, i.e. set partition signal 78, represented by $X_n$, is written to the delay memory 68. The set partition signal 78 is delayed by a variable amount of time and subsequently read out of the delay memory 68 in a different order than the order in which it was input to the delay memory 68, as determined by the address logic 70. The address logic 70 operates to align the delayed set partition signal 80 with the delayed input signals for the subsequent inner decoder. For example, in the case where the outer delay 69 is the outer delay 32 of the embodiment of FIG. 3, the address logic 70 operates to align the signal 54 with the signal 37.

Although illustrated with a single delay line (or element) in FIG. 9, the outer delay 69 may include several delay elements, which may also consist of a combination of several smaller delay lines. In the exemplary ATSC A/53 application, the typical outer delay size for ATSC A/53 application is 43884 symbols, or 53 Reed-Solomon codewords. The ATSC A/53 symbol rate is approximately 10.76 MHz, making the total delay time approximately 4.075 ms. The delay time varies from symbol to symbol, ranging from 0-4.075 ms according to the address logic. The delay element 68 may be made of registers, memory of any time or any other type of storage logic. In accordance with an aspect of the present invention, the size of the inner and outer delays are finely adjusted to trade-off cost and performance. For instance, it is possible to make the size of the outer delay 69 small enough that the address logic 70 sometimes refers to a memory location that has not been written by the previous modified outer decoder yet. Stated differently, it refers to a future output of the previous outer decoder. In such a case, the address logic 70 is configured to cause the flag 72 to indicate when the desired output, i.e. the signal 80, is not available. The flag 72 serves to inform the subsequent inner decoder that no set partition information is available for its current input.

When the flag 72 is indicative of the subsequent inner decoder having no set partition information that is available for its current input, the subsequent inner decoder operates as a conventional inner decoder. The same holds true for when the set partition information is not reliable due to failure of the outer decoder. Due to the variable delay, the set partition information is sometimes available, sometimes not. It is however, not necessary for it to be available all the time in order for performance improvements to be realized.

Figure 10:
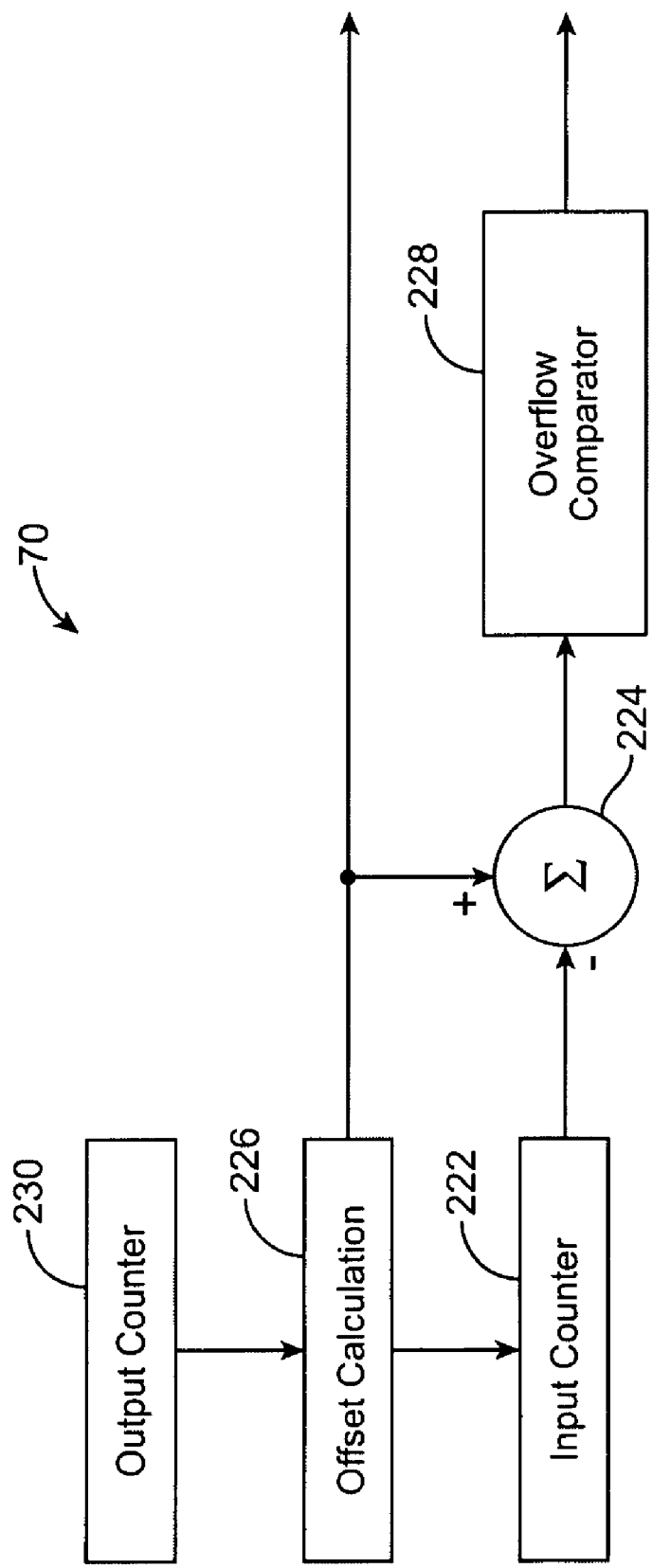
FIG. 10 shows further details of the address logic 70, in accordance with an embodiment of the present invention.

FIG. 10 shows further details of the address logic 70, in accordance with an embodiment of the present invention. Address logic 70 is shown to include an input counter 222, an output counter 230, an offset calculation circuit 226, a subtraction circuit 224, and an overflow comparator 228.

The input counter 222 is shown coupled to the circuit 224 and generates an output thereto that is subtracted from the output of the offset calculation circuit 226, which is also shown coupled to the circuit 224. The circuit 226 receives, as input, the output of the output counter 230. The circuit 226 in operation calculates an offset to be used in addressing the outer delay memory. The circuit 224 provides the result of its subtraction to the comparator 228 and the output of the comparator 228 is indicative of the result of the subtraction overflowing, or not, i.e. being equal to or greater than zero or not.

In the case of the offset calculation performed by circuit 226 for the ATSC A/53 embodiment, it can be generally described by the following subroutine below, in which case an assumption is made that the set partition information bits are stored in a 2-bit wide memory, and arranged from most significant to least significant X2X1 bits relative to the RS decoder output bytes. The subroutine is expressed in a C-code like notation that is well known in the art. However, the offset calculation is not limited to a software implementation, and could be derived using alternate logic as long as the offsets are generated in the same sequence as generated by the subroutine below.

```
off1 = (out_cnt%12)*4 + (out_cnt/12) + (out_cnt/48)*44;
off2 = (out_cnt%3312)/828;
if( (off2>0) && ( ((out_cnt%828)/12) < (4-off2) ) )
{
    if((out_cnt%12)<8)
        off1 += 16;
    else
        off1 -= 32;
}
off = 43264*(off1/208) - 828*(off1/4) + (off1%4);
```

For example, suppose the first RS output byte is expressed in binary notation as R7R6R5R4R3R2R1R0. The contents of memory locations at offsets 0, 1, 2, and 3 are R7R6, R5R4, R3R2, and R1R0, respectively. The input to the equations is the output counter ("out_cnt"), where out_cnt is 0 for the first symbol in a field. The output of the equations is an offset ("off") relative to the first symbol in a field. Depending on the configuration of the delay memory, the offset may need to be added to a start address in order to get the address of the desired set partition signal. Also, if a circular delay buffer is used, the pointer calculation must be performed modulo the delay buffer size.

The input counter 222 keeps track of the number of inputs stored in the delay memory. It may be reset to a fixed value periodically during reception. In an exemplary embodiment of the present invention using the ATSC A/53 standard, the input counter 222 is set to a fixed value when the first symbol of a field is processed by the sub-decoder. The fixed value is computed based on the inner delay size, such that the first symbol of the field is aligned with the proper set partition signal. The output counter 230 maintains the number of symbols generated by the outer delay 69. It may be periodically reset to zero during reception. In an exemplary embodiment of the present invention using the ATSC A/53 standard, the output counter 230 is reset to zero when the first symbol of a field is processed by the decoder. The offset calculation circuit 226 computes the address offset required to retrieve the proper set partition signal from the delay memory, corresponding to the current receive symbol.

The subtraction circuit 224 subtracts the input counter from the offset. A positive or 0 offset indicates that the set partition signal corresponding to the current receive symbol is not available yet. The overflow comparator 228 sets a flag 72 if the output of the subtraction circuit 224 is greater than or equal to 0. In an exemplary embodiment of the present invention using the ATSC A/53 standard, when the flag 72 is set, the output mux sets the set partition reliability sub-signal to "1", indicating that the set partition information is not reliable.

Figure 11:
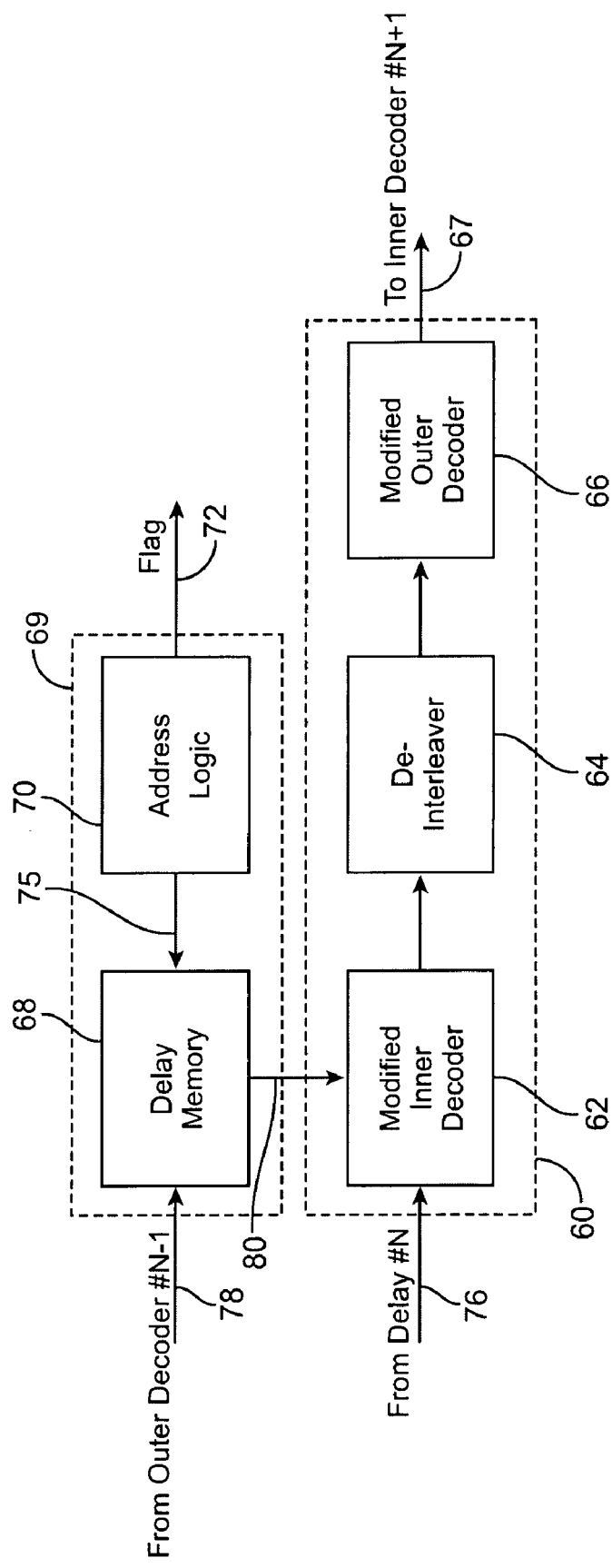
FIG. 11 shows the modified decoder 60 coupled to the outer delay 69 comprising one of the N stages of an iterative decoder of the various embodiments of the present invention.

FIG. 11 shows the modified decoder 60 coupled to the outer delay 69 comprising one of the N stages of an iterative decoder of the various embodiments of the present invention. The delay memory 68 is shown to receive the signal 78 and the modified inner decoder 62 is shown to receive the signal 76. The delay memory 68 is shown to provide the signal 80 to the modified inner decoder 62. The modified outer decoder 66 is shown to generate set partition signal 67 that is provided to subsequent inner decoder if the embodiment of FIG. 11 is any of the sub-decoders of an iterative decoder except the Nth sub-decoder. The outer delay 69 of FIG. 11 is shown without the optional Flag signal and output mux, so it represents the case where the inner delay size is big enough to compensate the worst-case sub-decoder delay.

FIG. 12 shows a receiver 90 to include a signal processing circuit 92, receiving an input 91 from an antenna, and coupled to a modified iterative decoder circuit 94, in accordance with another embodiment of the present invention. The iterative decoder circuit 94 functions as a diversity combiner. Rather than combining inputs from multiple antennas as in FIG. 3, iterative decoder circuit 94 combines inputs from a single antenna at multiple delays, with different set partition information.

The signal processing circuit 92 functions in the same manner as that of the signal processing circuits 48, 50, and 52 of FIG. 3 and is operative to generate a baseband signal 93 to the modified iterative decoder circuit 94. The modified iterative decoder circuit 94 is shown to include sub-decoders 103, 105 and 107, which include similar components and function in the same manner as that of the sub-decoders 26, 34 and 46, respectively. However, the sub-decoders of the embodiment of FIG. 12 are coupled in a different manner.

The sub-decoder 103 is shown to include an inner delay 95 responsive to the baseband signal 93 and operative to generate an inner delay signal 113 to a modified decoder 96, which is also shown included in the sub-decoder 103. The modified decoder 96 is shown to generate a set partition signal 107 to an outer delay 97, which is also shown included in the sub-decoder 103. The outer delay 97 is shown to generate the delayed set partition signal 115.

The sub-decoder 105 is shown to include an inner delay 98, a modified decoder 99 and an outer delay 91. The inner delay 98 is shown to be responsive to the signal 113 and operative to generate an inner delay signal 109 to the decoder 99, which is responsive to the signal 115. The decoder 99 is shown to generate a set partition signal 111 to the outer delay 91, which is shown to generate a delayed set partition signal 117. It should be noted that the outer delays 97 and 91 each have the same structure and function in the same manner as that of the outer delay 69. Thus, the set partition signal generated by their respective modified decoders is not only delayed but also aligned with the sequence or signal of a subsequent inner delay. For example, the address logic within the outer delay 97 causes the signal 115 to be aligned with the signal 109.

The sub-decoder 107 is shown to include an inner delay 93 coupled to a modified decoder 101. The inner delay 93 is shown to be responsive to the inner delay signal 109 and operative to generate an inner delay signal 119, which is input to the decoder 101. The decoder 101 is further responsive to the signal 117 and is operative to generate a signal sought to be received, or the output signal 121. Inner delay signals 113, 109, and 119 have fixed delays relative to the baseband signal 93. The fixed delay of signal 113 can be zero, effectively removing inner delay 95 from the iterative decoder circuit.

Due to the iterative decoding process the output signal 121 of FIG. 12 advantageously has the same or fewer bit errors than the output of a conventional single-pass decoder for the same input. Due to the novel structure employed in the present embodiment of the current invention, a performance gain can be achieved with reduced memory size compared to prior art iterative decoders. Reduced memory size generally results in reduced receiver manufacturing costs. An example of the gain in signal-to-noise ratio and memory capacity will be shortly presented.

In an exemplary embodiment of the present invention using ATSC A/53 application, the outer delay of receiver 90 can be configured to store only X1 bits as the set partition signal. Since there is only one antenna, tuner, and signal processing circuit, each sub-decoder input has the same noise signal. At noise levels that can be tolerated by the iterative decoder, the X2 bits can be reliably decoded as long as the state transitions in the trellis decoder are correct. Since only the X1 bits affect the trellis decoder state transitions, only they need to be stored for use by the subsequent sub-decoder. In contrast, when the noise signals in the sub-decoder inputs are uncorrelated with each other, as is often the case when multiple antennas are used, the X2 bits must be stored in the outer delay. Otherwise, the ability to decode them reliably will depend on the noise signal in the final sub-decoder input, which could conceivably be much higher than those of the previous sub-decoders.

The signals 121 and 45 experience reduced bit-error rates at low signal-to-noise ratios when compared with a conventional decoder. For the case of signal 121 in particular, the reduced bit-error rates can be achieved with less memory than is used by conventional iterative decoders, thereby reducing manufacturing costs of the receiver. An example of the gain in signal-to-noise ratio and memory capacity will be shortly presented.

The receiver 90 is shown to have only one input from an antenna rather the N number of antenna inputs received by the receiver 20. The receiver 90 is therefore simplified relative to the receiver 20. The receiver 90 generally has lower cost compared to receiver 20, because receiver 20 requires multiple antennas, tuners, and signal processing circuits, whereas receiver 90 requires only one of each. Also, the outer delay memory requirement may be smaller, as described above for the exemplary ATSC A/53 application. However, receiver 20 can achieve greater improvements in bit error rate, particularly when the noise at each antenna input is uncorrelated with the noise at other antenna inputs.

In the embodiment of FIG. 12, a single signal processing circuit 92 is used and its output is delayed by differing amounts for input to multiple decoders, as determined by the inner delays of the sub-decoders 103, 105 and 107. In FIG. 12, there are N number of sub-decoders and therefore N number of inner delays. It will also be appreciated by those skilled in the art that, in one embodiment of the present invention, the inner delays 95, 98 and 93 can be implemented by a combination of multiple delay elements or by a single delay element with multiple delayed outputs. Each delay element may consist of a single delay line or a combination of several smaller delay lines. Subsequent figures are presented and discussed to show examples of such variations.

It is understood that while the receivers 20 and 90 are each shown to include three sub-decoders, any number of sub-decoders may be employed. However, each sub-decoder adds more cost to the receiver, and there is a diminishing return, for example the gain of adding a $3^{rd}$ sub-decoder is less than the gain of adding a $2^{nd}$ sub-decoder.

FIG. 13 shows a three-stage receiver 201, including stages N−1, N and N+1, in accordance with an embodiment of the present invention. Note that in FIG. 13 the first outer delay, comprising of address logic 116 and delay memory 118 is shown to be part of sub-decoder 102, and the second outer delay, comprising of address logic 152 and delay memory 128 is shown to be part of sub-decoder 104. This is an alternative embodiment in contrast with receiver 90, wherein the outer delays 32 and 40 are depicted as part of sub-decoders 26 and 34, respectively. Alternative embodiments are contemplated where address logic 116 and delay memory 118 are a part of sub-decoder 100, and address logic 152 and delay memory 128 are a part of sub-decoder 102. The receiver 201 is similar to the receiver 90 with further details of the modified decoders and outer delay shown. The receiver 201 is shown to include a sub-decoder N−1 100, a sub-decoder N 102 and a sub-decoder N+1 104, in its three stages.

The sub-decoder N−1 is shown to include a modified inner decoder 110, a de-interleaver 112 and a modified outer decoder 114, which collectively comprise a modified decoder N−1. Modified inner decoder 110 is operative to generate inner decoder signal 302, which is received by de-interleaver 112. De-interleaver 112 is operative to generate de-interleaved signal 304, which is received by modified outer decoder 114. The sub-decoder N 102 is shown to include an inner delay 106, address logic 116, a delay memory 118, a modified inner decoder 151, a de-interleaver 122 and a modified outer decoder 124. Address logic 116 is operative to generate address logic signal 308, which is received by delay memory 118. Delay Memory 118 is operative to generate delayed set partition signal 312, which is received by modified inner decoder 151. The modified inner decoder 151, the de-interleaver 122 and the modified outer decoder 124 collectively comprise a modified decoder N and the address logic 116 and the delay memory 118 collectively comprise the outer delay N. Modified inner decoder 151 is operative to generate a modified inner decoder signal 314, which is received by de-interleaver 122. De-interleaver 122 is operative to generate a de-interleaved signal 316, which is received by modified outer decoder 124. The sub-decoder 104 is shown to include an inner delay 108, address logic 152, a delay memory 128, a modified inner decoder 153, a de-interleaver 132 and a modified outer decoder 134. Address logic 152 is operative to generate address logic signal 320, which is received by delay memory 128. The modified inner decoder 153, the de-interleaver 132 and the modified outer decoder 134 collectively comprise a modified decoder N+1 and the address logic 152 and the delay memory 128 collectively comprise the outer delay N+1. Modified inner decoder 153 is operative to generate a modified inner decoder signal 324, which is received by de-interleaver 132. De-interleaver 132 is operative to generate de-interleaved signal 326, which is received by modified outer decoder 134. The modified decoder N−1 is analogous to and operates in the same manner as the modified decoder 60. Similarly, the modified decoders N and N+1 are each analogous to the modified decoder 60. The outer delays N and N+1 each are analogous to the outer delay 69. The inner delays 106 and 108 are each analogous to the inner delay 28 or 36 or 42 or 95 or 98 or 93.

The embodiment of FIG. 13 is different in that the signal 300, which is from a single signal processing circuit is coupled to the inner delay 106 of the sub-decoder N 102 and the modified inner decoder 110 of the sub-decoder N−1. Note that a similar configuration could be achieved by removing inner delay 95 from FIG. 12. The inner delay 106 generates an inner delay signal 306 that is coupled to the inner delay 108 of the sub-decoder N+1 and to the modified inner decoder 151 of the sub-decoder N 102. The modified outer decoder 114 of the sub-decoder N−1 is set partition signal 210, which is coupled to the delay memory 118 of the sub-decoder N 102. The modified outer decoder 124 generates a set partition signal 318, which is coupled to the delay memory 128 of the sub-decoder N+1 104. The modified outer decoder 134 of the sub-decoder N+1 104 generates the output signal 328, which is the signal sought to be decoded. With each stage of the receiver 201, the set partition signal generated by each stage includes fewer errors than the previous stage. Thus, the signal-to-noise ratio required in order to achieve a desired bit error rate is lower for each additional stage.

The sub-decoders N 102 and N+1 104 are shown to include the same structure as the modified decoder 60 but the sub-decoder N−1 does not include inner and outer delays.

FIG. 14 shows a receiver 120 in accordance with another embodiment of the present invention. The receiver 120 includes a signal processing circuit 122 responsive to a signal from an antenna and further includes an iterative decoder 124 much in the same manner as the receiver 90 except that the iterative decoder 124 of the receiver 120 includes one inner delay 126 that generates inner delay signals 181, 183 and 185 to the modified decoders 128, 132 and 136, respectively. Note that inner delay signal 181 may have zero delay relative to the baseband signal output of the signal processing circuit. The modified decoders 128, 132 and 136 are analogous to the decoders 96, 99, and 101, respectively and the outer delays 130 and 134 are analogous to the outer delays 97 and 91, respectively. The connectivity between the modified decoders and outer delays in the iterative decoder 124 is analogous to the corresponding connectivity of the iterative decoder 94. Decoder 136 is operative to generate the output signal 138, which is the signal sought to be decoded.

FIG. 15 shows a receiver 140 in accordance with yet another embodiment of the present invention. The receiver 140 includes a signal processing circuit 142 responsive to a signal from an antenna and further includes an iterative decoder 143 much in the same manner as the receiver 120 except that the iterative decoder 143 of the receiver 140 includes one outer delay 146. For example, all of the outer delays 130 and 134 of iterative decoder 124 are combined into one outer delay 146. Inner delay 144 is shown coupled to decoders 148, 150 and 136. If the delay sizes are designed to be less than the worst-case sub-decoder delay, causing set partition information from the immediately previous sub-decoder to sometimes be unavailable, it may be advantageous to use a single outer delay as in FIG. 15. That way, a sub-decoder can use set partition information from any of the previous sub-decoders, not just from one sub-decoder immediately preceding it. Another advantage of the single outer delay architecture is that for reliable set partition information generated by previous sub-decoders, it is not necessary for subsequent sub-decoders to generate the set-partition information again. Subsequent sub-decoders only need to generate set partition information when the previous sub-decoder set partition outputs are unreliable. This reduces the amount of RS decoder operations required, reducing the overall implementation complexity. Note that the same advantage could be achieved in receiver 90 by coupling each outer delay to all subsequent sub-decoders, rather than just the immediately subsequent sub-decoder. In general, receivers 90, 120, and 140 are functionally equivalent and achieve the same performance gains. The selection of which memory architecture to use is typically based on design considerations beyond the scope of the invention.

FIG. 16 shows an embodiment of the outer delay of the modified decoders of the single antenna embodiments of the present invention for the exemplary ATSC A/53 application. More specifically, MEM1 160 is configured to store the $X_1$ bits of N Reed-Solomon decoding operations, and MEM2 162 is configured to store the pass/fail indication of N Reed Solomon decoding operations (performed by the modified outer decoder). As illustrated, the size of MEM1 160 is 828*N bits, and the size of MEM2 162 is N bits. MEM1 160 and MEM2 162 could be implemented at different address offsets within a signal memory element, or they could be two separate memory elements. The memory structure of FIG. 16 is for illustration purposes only, and it will be understood by those skilled in the art that alternate memory configurations exist and are within the scope of the present invention. In one alternative configuration, the pass/fail bits in MEM2 could be replicated for each X1 bit in MEM1, increasing the bit-width of MEM1 and increasing the total memory size to 828*N*2 bits.

FIG. 17 shows a flowchart illustrating one embodiment of the steps performed by the address logic 70 used to read out the set partition signal for use by the modified inner decoder 62. These steps perform the functions of a modified trellis decoder. Note that the procedure illustrated in FIG. 17 can be used for calculating the offset described above with reference to the offset calculation circuit 226 of FIG. 10. Additionally, the memory structure illustrated in FIG. 16 is assumed, with the set partition signal stored in MEM1, and set partition reliability signal stored in MEM2. The procedure illustrated in the flowchart of FIG. 17 is performed once for every input to the trellis decoder (inner decoder), and produces the address of the corresponding set partition signal in the delay memory (MEM1.) The procedure accounts for the effects of both the convolutional byte interleaver and the trellis code interleaver specified in A/53. In this procedure, the first step 172 is to check whether the current trellis decoder input is the first one of a field as defined in the ATSC A/53 standard. If so, at step 174, the internal counters MOD52, MOD12, and MOD4, and the trellis index offset TRE are all initialized to 0. Also, the pointer value PTR1 is set to an initial value P, chosen such that the set partition signal at address P is aligned with the first trellis decoder input of the field. After step 174, or if the determination at 172 is negative, step 188 checks if the current trellis decoder input is the first one in a segment as defined in the ATSC A/53 standard. If so, MOD4 is compared to 0 in step 190. If MOD4 is not equal to 0, then TRE is set to 4 in step 192. After step 192, or if MOD4 is not equal to 0 in step 190, or if the current symbol is not the first one in a segment as determined by step 188, the pointer value PTR is calculated in step 176 as a function of MOD52,MOD12, TRE, PTR1, and the overall memory size (MEM_SIZE). Note that the modulo operator '%' is used to indicate the remainder after division of two operands, as is commonly used in the art. Next, at step 178, the value of MOD12 is updated for use in the next trellis decoder input interval. In step 180, MOD12 is compared to 0. IF MOD12 is equal to 0, at step 182 the value of MOD4 is updated. After step 182, if taken, MOD4 is compared to 0 in step 184. If MOD4 is equal to 0, then the value of MOD52, PTR1, and TRE are updated in step 186. After step 186, or if MOD12 was not 0 in step 180, or if MOD4 was not 0 in step 184, the end step 194 of the procedure for one trellis decoder input is reached.

The set partition signal at address PTR in MEM1 is output to the modified trellis decoder for use in constellation set partition. In addition, the address of the corresponding set partition reliability signal in MEM2 is calculated as floor (PTR/(207*4)), where the floor( ) function returns the closest integer less than or equal to its operand. Also, if the memory size is designed to be smaller than the full interleaver depth, then the PTR must be validated to make sure it does not point to a future set partition signal not yet generated by the previous modified outer decoder, which is essentially a modified Reed-Solomon decoder. If PTR does point to a future set partition signal, then a default set partition signal is output to the trellis decoder, and the set partition reliability signal is set to indicate that the set partition signal is unreliable.

Table 2 shows simulated performance results for various embodiments of the present invention where the delay memory 68 is of sufficient size to handle the worst-case sub-decoder delay, such that the address logic 70 never refers to future outer decoder outputs. For the sake of this example a simple Additive White Gaussian Noise (AWGN) channel model is presumed. Uncorrelated noise sources are used for each receive antenna. Data is encoded according to ATSC A/53, and the output is monitored for 2500 fields (equivalent to about 1 minute in real time.) The SNR reported in Table 2 represents the highest noise level for which there were no bit errors in 2500 fields, to the nearest 0.1 dB. The first row is a reference value, representing performance of a prior art receiver. The gain column in Table 2 is referenced to this value.

TABLE 2

| # of Receive antennas | # of decoder paths | SNR (dB) | gain (dB) |
|---|---|---|---|
| 1 | 1 | 14.7 | 0.0 |
| 1 | 2 | 14.2 | 0.5 |
| 1 | 3 | 13.9 | 0.8 |
| 1 | 4 | 13.7 | 1.0 |
| 2 | 2 | 14.0 | 0.7 |
| 3 | 3 | 13.7 | 1.0 |
| 4 | 4 | 13.5 | 1.2 |
| 5 | 5 | 13.4 | 1.3 |

In the case of prior art block-selection diversity combining, using 2 antennas and 2 decoder paths, the SNR result is approximately 14.3 dB, for a gain of 0.4 dB. This compares to the 2 antenna, 2 decoder path result of 14.0 dB in Table 2, for a gain of 0.7 dB. The diversity combining iterative decoder of this invention outperforms prior art block-selection diversity combining.

To illustrate the tradeoff between delay size and performance, the case of 1 receive antenna and 2 decoder paths with various delay sizes between the decoders is taken into account, the results of which are shown in Table 3, below. This case is with ATSC A/53 signals and a simple AWGN channel model. In Table 3, delay size is normalized so that 1.0 represents the maximum useful delay, where all set partition outputs from the first outer decoder are available in time for the second inner decoder to use them. Delay size 0.0 represents the prior art case with only 1 decoder path.

TABLE 3

| Delay size | SNR (dB) | gain (dB) |
|---|---|---|
| 0.00 | 14.7 | 0.0 |
| 0.07 | 14.7 | 0.0 |
| 0.15 | 14.7 | 0.0 |
| 0.17 | 14.7 | 0.0 |
| 0.18 | 14.7 | 0.0 |
| 0.20 | 14.6 | 0.1 |
| 0.22 | 14.6 | 0.1 |
| 0.26 | 14.5 | 0.2 |
| 0.28 | 14.5 | 0.2 |
| 0.30 | 14.4 | 0.3 |
| 0.38 | 14.4 | 0.3 |
| 0.39 | 14.4 | 0.3 |
| 0.41 | 14.4 | 0.3 |
| 0.43 | 14.3 | 0.4 |
| 0.45 | 14.3 | 0.4 |
| 0.53 | 14.3 | 0.4 |
| 0.61 | 14.3 | 0.4 |
| 0.62 | 14.3 | 0.4 |
| 0.64 | 14.3 | 0.4 |
| 0.66 | 14.2 | 0.5 |
| 0.70 | 14.2 | 0.5 |
| 0.78 | 14.2 | 0.5 |
| 0.85 | 14.2 | 0.5 |
| 0.93 | 14.2 | 0.5 |
| 1.0 | 14.2 | 0.5 |

As can be seen in Table 3, the 0.5 dB gain achievable with 2 decoders is possible using only 66% of the maximum useful memory size (i.e., the size necessary to ensure set partition information is always available). Therefore, the diversity combining iterative decoder of this invention can be implemented at a lower cost than prior art iterative decoders that do not allow fine-tuning of the delay between iterations.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. An iterative decoder circuit operative to provide an output signal in response to a received signal, comprising:
an N number of sub-decoders, N−1 of the sub-decoders each responsive to a baseband signal from one of M number of signal processing circuits, M being an integer number, where M ranges from 1 to N−1; and
N being an integer number, each of the N−1 number of sub-decoders including,
an inner delay responsive to a baseband signal provided by a corresponding signal processing circuit and operative to generate an inner delayed signal,
a modified decoder responsive to the inner delayed signal and operative to generate a set partition signal, the set partition signal of some of the N number of modified decoders having less errors than previous set partition signals,
an Nth inner delay responsive to the baseband signal provided by an Nth signal processing circuit and operative to provide an Nth inner delayed signal,
an Nth modified decoder responsive to the Nth inner delayed signal and to the set partition signal and operative to provide an output signal, wherein the probability of error of the output signal is reduced by correcting errors in some of the set partition signals.

2. An iterative decoder circuit as recited in claim 1 wherein the N−1 number of sub-decoders further includes an outer delay responsive to the set partition signal and is operative to generate a delayed set partition signal to be used by a subsequent sub-decoder.

3. An iterative decoder circuit, as recited in claim 2, wherein at least one outer delay includes a delay memory coupled to a sub-decoder responsive to a set partition signal from the sub-decoder and operative to generate a delayed set partition signal to a subsequent sub-decoder, wherein the outer delay further includes at least one address logic operative to generate a address logic signal provided to the delay memory, and the address logic is operative to align the set partition signal with an inner delay signal.

4. An iterative decoder circuit, as recited in claim 3, wherein the address logic is operative to generate a flag indicative of the set partition signal corresponding to the current receive symbol being processed by a sub-decoder not yet being available.

5. An iterative decoder circuit, as recited in claim 4, which further includes a output multiplexer responsive to a delayed set partition signal and the flag, and operative to generate a default set partition signal indicative of the set partition information being unreliable, wherein when said flag is set, the output multiplexer generates the default set partition signal indicative that the set partition information is unreliable, and when said flag is not set, the output multiplexer outputs the set partition signal based on the address logic.

6. An iterative decoder circuit, as recited in claim 1, wherein N number of sub-decoders is equal to M number of signal processing circuits.

7. An iterative decoder circuit, as recited in claim 1, wherein N number of sub-decoders is less than M number of signal processing circuits.

8. An iterative decoder circuit, as recited in claim 7, wherein M is equal to 1.

9. An iterative decoder circuit, as recited in claim 1, wherein each of the N sub-decoders includes a modified inner decoder responsive to the delayed set partition signal from the outer delay and the inner delayed signal and operative to generate a modified inner decoder signal, each of the sub-decoders further including a de-interleaver responsive to the modified inner decoder signal and operative to generate a de-interleaved signal, each of the sub-decoders further including a modified outer decoder responsive to the de-interleaved signal and operative to generate the set partition signal, and the last of N sub-decoders includes a conventional outer decoder operative to generate the signal sought to be decoded.

10. An iterative decoder circuit, as recited in claim 9, wherein the modified inner decoder includes:
coset slicer, responsive to a received symbol and operative to detect the nearest symbol in one or more cosets of the transmit constellation to the receive symbol, and operative to generate coset decisions and associated branch metrics; and
branch selection circuit, responsive to the coset decisions and branch metrics and responsive to a set partition input signal, and operative to select the best branch for each state of a trellis code, and to store coset decisions for the best branches, and operative to accumulate path metrics for each state; and
path traceback circuit, responsive to the stored coset decisions and path metrics, and operative to generate a branch selection circuit signal that represents the best receive symbol at a fixed delay from the receive symbol.

11. An iterative decoder circuit, as recited in claim 10, wherein the modified outer decoder includes a Reed-Solomon decoder and a byte to symbol conversion circuit coupled to the Reed-Solomon decoder, said Reed-Solomon decoder being responsive to a de-interleaved signal, and operative to generate an error corrected output provided to both a subsequent outer delay and to said byte to symbol conversion circuit, said byte to symbol conversion circuit being responsive to said error corrected output and operative to extract set partition information for each symbol from said error corrected output.

12. An iterative decoder circuit, as recited in claim 11, wherein the Reed-Solomon decoder is operative to receive a de-interleaved signal which includes codewords of a fixed number of bytes, and wherein some of the bytes are data bytes and the remaining bytes are parity bytes which are added to the data bytes by said Reed-Solomon decoder based on a generator polynomial.

13. An iterative decoder circuit operative to provide an output signal in response to a received signal, comprising:
an inner delay responsive to a baseband signal provided by a signal processing circuit and operative to generate an N number of inner delayed signals,
N number of modified decoders, each responsive to a corresponding one of the N number of inner delayed signals and operative to generate a set partition signal, the set partition signal of some of the N number of modified decoders having less errors than previous set partition signals,
wherein the set partition signal of a previous modified decoder is provided as input to a subsequent modified decoder, and wherein the overall probability of error is reduced by correcting errors in some of the set partition signals.

14. An iterative decoder circuit as recited in claim 13, further including N number of outer delays, each outer delay responsive to a corresponding one of the N number of set partition signals and operative to generate a delayed set partition signal to be used by a subsequent modified decoder.

15. An iterative decoder circuit as recited in claim 13, further including an outer delay responsive to the N number of set partition signals and operative to generate a delayed set partition signal to be used by a subsequent modified decoder.

16. An iterative decoder circuit as recited in claim 15, wherein each of the N sub-decoders includes a modified inner decoder responsive to the delayed set partition signal from the outer delay and the inner delayed signal and operative to generate a modified inner decoder signal, each of the sub-decoders further including a de-interleaver responsive to the modified inner decoder signal and operative to generate a de-interleaved signal, each of the sub-decoders further including a modified outer decoder responsive to the de-interleaved signal and operative to generate the set partition signal, and the last of N sub-decoders includes a conventional outer decoder operative to generate the signal sought to be decoded.

17. An iterative decoder circuit comprising:
means for receiving a baseband signal;
N number of sub-decoders, each including,
means for generating a inner delayed signal in response to the received baseband signal;
means for receiving the inner delay signal and generating a set partition signal;
means for receiving the baseband signal and generating a Nth inner delayed signal;

means for receiving the Nth inner delayed signal as well as a generated set partition signal and generating a output signal in response to both said received signals; and wherein the probability of errors in the set partition signal of each sub-decoder is reduced in at least some of the N number of set partition signals.

18. A sub-decoder operative to reduce the probability of error in the decoded signal as recited in claim 17, further comprising:
means for receiving the set partition signal and generating a delayed set partition signal to be used by a subsequent sub-decoder.

19. A method of iteratively decoding a received signal comprising:
  a. receiving at least one baseband signal from at least one signal processing circuit, the baseband signal including noise;
  b. generating at least one inner delayed signal from the received baseband signal;
  c. generating a set partition signal from a inner delayed signal;
  d. generating a delayed set partition signal from the set partition signal;
  e. generating a set partition signal from the inner delayed signal and a delayed set partition signal;
  f. generating a delayed set partition signal from the set partition signal;
  g. repeating step e. through step f. N−2 number of times thereby reducing the probability of errors in the delayed set partition signal every time steps e.-f. are performed;
  h. generating the signal sought to be decoded from an inner delayed signal and an N−1 delayed set partition signal.

20. A method of iteratively decoding a received signal, as recited in claim 19, wherein step e. comprises:
  a. receiving the delayed set partition signal from a outer delay and receiving the inner delayed signal from the inner delay;
  b. generating a modified inner decoder signal from the delayed set partition signal and the inner delayed signal;
  c. generating a de-interleaved signal from the modified inner decoder signal; and
  d. generating a set partition signal from the de-interleaved signal and passing the set partition signal to an outer delay.

21. An iterative decoder circuit operative to provide an output signal in response to a received signal, comprising:
  an inner delay responsive to a baseband signal provided by a signal processing circuit and operative to generate an N number of inner delayed signals,
  N number of modified decoders, each responsive to a corresponding one of the N number of inner delayed signals and operative to generate a set partition signal, some of the N number of set partition signals having less errors than a previous set partition signal,
  an outer delay responsive to the set partition signals from the N number of modified decoders for coupling the same to a subsequent modified decoder of the N number of modified decoders.

22. An iterative decoder circuit as recited in claim 21, wherein each of the N sub-decoders includes a modified inner decoder responsive to the delayed set partition signal from the outer delay and the inner delayed signal and operative to generate a modified inner decoder signal, each of the sub-decoders further including a de-interleaver responsive to the modified inner decoder signal and operative to generate a de-interleaved signal, each of the sub-decoders further including a modified outer decoder responsive to the de-interleaved signal and operative to generate the set partition signal, and the last of N sub-decoders includes a conventional outer decoder operative to generate the signal sought to be decoded.

* * * * *